(12) United States Patent
Cheng et al.

(10) Patent No.: US 9,490,223 B2
(45) Date of Patent: Nov. 8, 2016

(54) STRUCTURE TO PREVENT DEEP TRENCH MOAT CHARGING AND MOAT ISOLATION FAILS

(71) Applicant: GLOBALFOUNDRIES INC., Grand Cayman (KY)

(72) Inventors: Kangguo Cheng, Schenectady, NY (US); Joseph Ervin, Wappingers Falls, NY (US); Juntao Li, Cohoes, NY (US); Chengwen Pei, Danbury, CT (US); Geng Wang, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/566,773

(22) Filed: Dec. 11, 2014

(65) Prior Publication Data

US 2016/0172314 A1    Jun. 16, 2016

(51) Int. Cl.
| | |
|---|---|
| *H01L 21/70* | (2006.01) |
| *H01L 23/00* | (2006.01) |
| *H01L 29/06* | (2006.01) |
| *H01L 21/762* | (2006.01) |

(52) U.S. Cl.
CPC ....... *H01L 23/564* (2013.01); *H01L 21/76229* (2013.01); *H01L 29/0646* (2013.01); *H01L 29/0649* (2013.01)

(58) Field of Classification Search
CPC ...................................................... H01L 23/564
USPC ........................................................... 257/509
See application file for complete search history.

(56) References Cited

U.S. PATENT DOCUMENTS

| 8,294,203 B2 | 10/2012 | Van Noort et al. | |
|---|---|---|---|
| 8,647,945 B2 | 2/2014 | Wang et al. | |
| 2012/0139080 A1* | 6/2012 | Wang ................... | H01L 21/743 257/506 |
| 2014/0154849 A1 | 6/2014 | Wang et al. | |

* cited by examiner

*Primary Examiner* — Anthony Ho
(74) *Attorney, Agent, or Firm* — Scully, Scott, Murphy & Presser, P.C.

(57) ABSTRACT

A semiconductor structure is provided that includes a semiconductor on insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer. A deep trench moat (DTMOAT) is disposed in the SOI substrate and has a bottom surface contacting a dopant region of the bottom semiconductor layer. A moat contact electrically connecting the DTMOAT to the epitaxial semiconductor layer of the SOI substrate. Charges accumulated in the DTMOAT can be discharged through the heavily doped epitaxial semiconductor layer to ground, thus preventing the DTMOAT failure caused by the process-induced charge accumulation.

9 Claims, 18 Drawing Sheets

STRUCTURE TO PREVENT DEEP TRENCH MOAT CHARGING AND MOAT ISOLATION FAILS

FIELD OF THE INVENTION

The present application relates to the fabrication of semiconductor devices, and more particularly to the formation of moat contacts that prevent moat isolation failure caused by process-induced deep trench moat charging.

Deep trench isolations, so called deep trench moats (DT-MOATs), have been used in integrated circuits to provide electrical isolation between adjacent semiconductor circuits. This can significantly reduce circuit noise and interference between different devices and circuits on VLSI chips, hence improving the performance at chip level. Conventionally, DTMOATs are formed in a semiconductor-on-insulator (SOI) substrate and then covered during transistor device fabrication. Charges generated during the fabrication of the transistor devices, for example, during the plasma etching processes, may be accumulated within a DTMOAT, causing the break down or damages to the electrical isolation provided by the DTMOAT. As such, a method that allows discharging of the accumulated charges from the DTMOAT, thus preventing moat isolation failure at an early fabrication stage, is needed.

SUMMARY

The present application provides moat contacts that electrically connect a DTMOAT to a heavily doped epitaxial semiconductor layer of a semiconductor-on-insulator substrate (SOI) such that charges accumulated in the DTMOAT can be discharged through the heavily doped epitaxial semiconductor layer to ground. The DTMOAT failure caused by the process-induced charge accumulation can thus be prevented.

In one aspect of the present application, a semiconductor structure is provided. The semiconductor structure includes a semiconductor-on-insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer. The semiconductor structure further includes a deep trench moat (DTMOAT) disposed in the SOI substrate and having a bottom surface contacting a dopant region of the bottom semiconductor layer and a moat contact electrically connecting the DTMOAT to the epitaxial semiconductor layer of the SOI substrate.

In another aspect of the present application, a method of forming a semiconductor structure is provided. The method includes first providing a semiconductor-on-insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer. A moat trench is then formed within the SOI substrate. The moat trench extends from a top surface of the top semiconductor layer through the buried insulator layer and the epitaxial semiconductor layer and into the bottom semiconductor layer. Next, a deep trench moat (DTMOAT) is formed within the moat trench. The DTMOAT includes at least a dielectric liner present on sidewalls and a bottom surface of the moat trench and a trench conductor present on the dielectric liner that fills a portion of the moat trench. After forming a contact trench to expose at least a portion of the DTMOAT and a portion of the epitaxial semiconductor layer adjacent to the DTMOAT, a moat contact is formed within the contact trench. The moat contact electrically connects the DTMOAT to the epitaxial semiconductor layer.

In yet another aspect of the present application, a method of forming a semiconductor structure is provided. The method includes first providing a semiconductor-on-insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer. A moat trench is then formed within the SOI substrate. The moat trench extends from a top surface of the top semiconductor layer through the buried insulator layer and the epitaxial semiconductor layer and into the bottom semiconductor layer. Next, a deep trench moat (DTMOAT) is formed within the moat trench. The DTMOAT includes at least a dielectric liner present on sidewalls and a bottom surface of the moat trench and a trench conductor present on the dielectric liner that fills a portion of the moat trench. The topmost surfaces of the DTMOAT are located below a top surface of the buried insulator layer and a bottom surface of the buried insulator layer. Next, a semiconductor cap is formed on top of the DTMOAT. The semiconductor cap has a width greater than a width of the DTMOAT and has a top surface coplanar with a top surface of the top semiconductor layer. After forming a contact trench to expose a portion of the semiconductor cap and a portion of the epitaxial semiconductor layer adjacent to the DTMOAT, a moat contact is formed within the contact trench. The moat contact electrically connects the DTMOAT to the epitaxial semiconductor layer through the semiconductor cap.

DETAILED DESCRIPTION OF THE INVENTION

Figure 1:
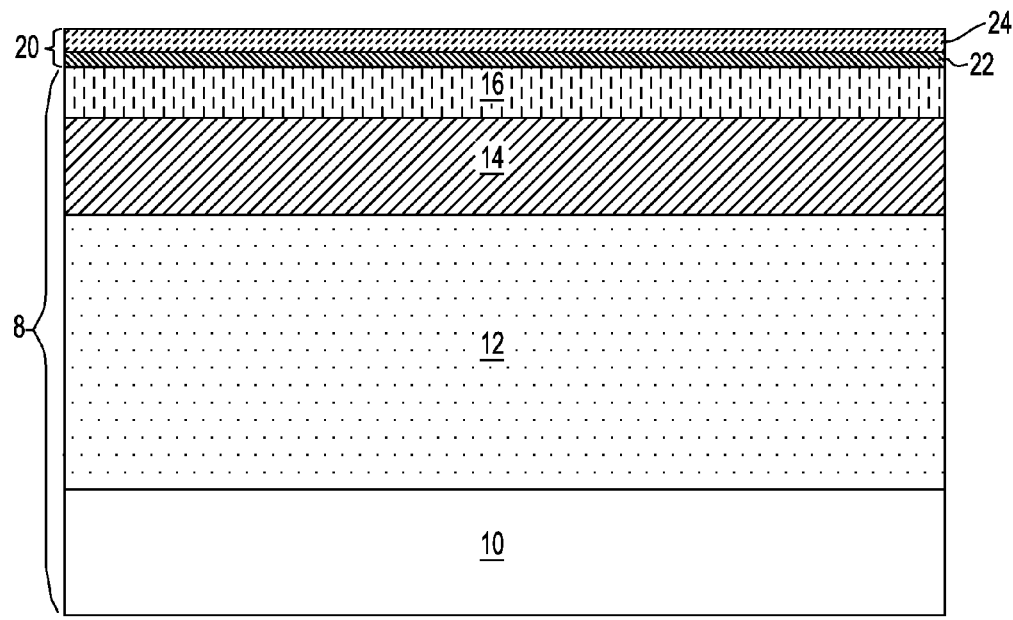
FIG. 1 is a cross-sectional view of an exemplary semiconductor structure including a semiconductor-on-insulator (SOI) substrate and a pad dielectric stack formed thereupon that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, there is illustrated an exemplary semiconductor structure that can be employed in accordance with an embodiment of the present application. Specifically, the semiconductor structure includes a semiconductor-on-insulator (SOI) substrate 8 having a pad dielectric stack 20 formed thereupon. The SOI substrate 8 includes, from bottom to top, a bottom semiconductor layer 10, an epitaxial semiconductor layer 12, a buried insulator layer 14, and a top semiconductor layer 16. The buried insulator layer 14 isolates the top semiconductor layer 16 form the epitaxial semiconductor layer 12 and the bottom semiconductor layer 10.

The bottom semiconductor layer 10 may include a semiconductor material, such as, for example, Si, Ge, SiGe, SiC, SiGeC, a compound semiconductor material such as a III-V compound semiconductor material or a II-VI compound semiconductor material, or a combination thereof. In one embodiment, the bottom semiconductor layer 10 is composed of single crystalline silicon. The thickness of the bottom semiconductor layer 10 can be from 50 μm to 2 mm, although less and greater thicknesses can also be employed.

The bottom semiconductor layer 10 can be doped with dopants of a first conductivity type, which can be p-type or n-type. As used herein, the term "p-type" refers to the addition of impurities to an intrinsic semiconductor that creates deficiencies of valence electrons, while the term "n-type" refers to the addition of impurities that contribute free electrons to an intrinsic semiconductor. Exemplary p-type dopants include, but are not limited to, boron, aluminum, gallium and indium. Exemplary n-type dopants include, but are not limited to, antimony, arsenic and phosphorous. In one embodiment, the bottom semiconductor layer 10 is composed of silicon doped with p-type dopants. The dopants may be introduced to the bottom semiconductor layer 10 by ion implantation or by an in-situ doping process that is employed while the material of the bottom semiconductor layer 10 is being formed. The concentration of dopants that are present in the bottom semiconductor layer 10 is typically greater than $1\times10^{15}$ atoms/cm$^3$. In one embodiment, the concentration of dopants that are present in the bottom semiconductor layer 10 ranges from $1\times10^{16}$ atoms/cm$^3$ to $1\times10^{17}$ atoms/cm$^3$.

The epitaxial semiconductor layer 12 may include any suitable conductive material, for example, a heavily doped semiconductor material. In one embodiment, the epitaxial semiconductor layer 12 may include any material listed above for the bottom semiconductor layer 10 that is doped with dopants of a second conductivity type opposite to the first conductivity type. For example, the bottom semiconductor layer 10 can be p-doped single crystalline silicon, and the epitaxial semiconductor 12 can be n-doped single crystalline silicon, or vice versa. In one embodiment, in which the epitaxial semiconductor layer 12 is doped to provide an n-type type conductivity, the dopant may be phosphorus present in a concentration ranging from $1\times10^{18}$ atoms/cm$^3$ to $5\times10^{21}$ atoms/cm$^3$ The epitaxial semiconductor layer 12 can be formed by an epitaxial growth. Epitaxial growth and/or deposition" means the growth of a semiconductor material on a deposition surface of a semiconductor material, in which the semiconductor material being grown has the same crystalline characteristics as the semiconductor material of the deposition surface. Thus, an epitaxial film deposited on a <111> crystal surface will take on a <111> orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxial semiconductor layer 12. Silicon sources for epitaxial growth include silicon tetrachloride, dichlorosilane ($SiH_2Cl_2$), and silane ($SiH_4$). The temperature for epitaxial silicon deposition may range from 750° C. to 900° C. Although higher temperature typically results in faster deposition, the faster deposition may result in crystal defects and film cracking. The n-type dopants may be introduced to the epitaxial semiconductor layer 12 during the epitaxial growth process that forms the layer. The epitaxial semiconductor layer 12 that is formed may have a thickness ranging from 1 µm to 5 µm, although lesser or greater thicknesses can also be employed.

The buried insulator layer 14 may include a dielectric material such as silicon oxide, silicon nitride, silicon oxynitride, or a combination thereof. In one embodiment, the buried insulator layer 14 may be formed by a deposition process, such as chemical vapor deposition (CVD) or physically vapor deposition (PVD). In another example, the buried insulator layer 20 may be formed using a thermal growth process, such as thermal oxidation, to convert a surface portion of the epitaxial semiconductor layer 12. The thickness of the buried insulator layer 14 that is formed can be from 50 nm to 200 nm, although lesser or greater thicknesses can also be employed.

The top semiconductor layer 16 may include a semiconductor material, such as, for example, Si, Ge, SiGe, SiC, SiGeC, a compound semiconductor material such as a III-V compound semiconductor material or a II-VI compound semiconductor material, or a combination thereof. The semiconductor materials of the top semiconductor layer 16 and the bottom semiconductor layer 10 may be the same or different. In one embodiment, the top semiconductor layer 16 includes comprises a single crystalline semiconductor material, such as, for example, single crystalline silicon. The top semiconductor layer 16 may or may not be doped with p-type dopants and/or n-type dopants. The top semiconductor layer 16 may be formed by a deposition process, such as CVD or plasma enhanced CVD (PECVD). The top semiconductor layer 16 that is formed may have a thickness from 10 nm to 200 nm, although lesser or greater thicknesses can also be employed.

At least one pad dielectric layer can be deposited on the SOI substrate 8 as an etch mask for forming trenches in the SOI substrate 8. In one embodiment and as shown in FIG. 1, the at least one pad dielectric layer is a material stack including a nitride pad layer 22 that is present on the topmost surface of the SOI substrate 8, and a hard mask layer 24 that is present on a top surface of the nitride pad layer 22. The material stack is herein referred to as a pad dielectric stack 20.

The nitride pad layer 22 may be composed of any nitride-containing dielectric material, such as silicon nitride or silicon oxynitride. The nitride pad layer 22 can be formed by a deposition process, such as CVD or PVD. The nitride pad layer 22 may have a thickness ranging from 50 nm to 200 nm, although lesser and greater thicknesses can also be employed.

The hard mask layer 24 may be composed of an oxide containing material, such as silicon oxide. The hard mask layer 24 may also be composed of silicon carbide, silicon carbonitride, silsequioxane, siloxane, a borosilicate glass (BSG), or a boron phosphate silicate glass (BPSG). The hard mask layer 24 can be formed by a deposition process, such as CVD or spin on deposition. The hard mask layer 24 may have a thickness ranging from 50 nm to 500 nm, although lesser and greater thicknesses can also be employed.

Figure 2:
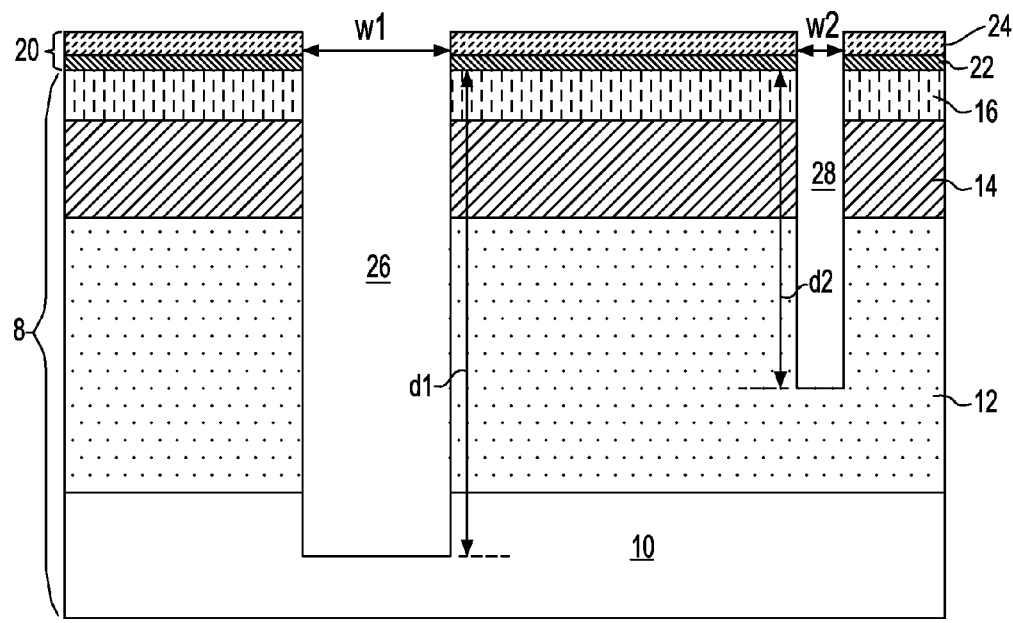
FIG. 2 is a cross-sectional view of the exemplary semiconductor structure of FIG. 1 after forming a moat trench and a capacitor trench in the SOI substrate.

Referring to FIG. 2, a moat trench 26 and a capacitor trench 28 are formed in the SOI substrate 8. Prior to etching the SOI substrate 8, the pad dielectric stack 20 is patterned and etched to provide an etch mask. In one embodiment, a pattern is produced by applying a photoresist (not shown) on the topmost surface of the pad dielectric stack 20, exposing the photoresist to a pattern of radiation, and then developing the pattern into the photoresist utilizing a resist developer. An anisotropic etch such as reactive ion etch (RIE) can be performed to transfer the pattern in the photoresist into the pad dielectric stack 20. The remaining photoresist can be subsequently removed, for example, by ashing.

The pattern in the pad dielectric stack 20 is transferred into the SOI substrate 8 by an anisotropic etch that employs the patterned pad dielectric stack 20 as an etch mask. The etch mask includes a moat opening having a first width w1 and a capacitor opening having a second width w2. The first width w1 is greater than the second width w2. In one embodiment, the first width w1 can be greater than 150% of the second width w2. In another embodiment, the first width w1 can be at least three times the second width w2. The first width w1 of the moat opening can be from 100 nm to 1 µm, although lesser and greater widths can also be employed.

The second width of the capacitor opening can be from 60 nm to 100 nm, although lesser and greater widths can also be employed. In an illustrative example, the first width w1 is 250 nm, and the second width w2 is 80 nm.

The pattern of the moat opening and the capacitor opening in the pad dielectric stack 20 is transferred into the SOI substrate 8 to simultaneously form the moat trench 26 and the capacitor trench 28. Anisotropic etch processes that are suitable for forming the moat trench 26 and the capacitor trench 28 in the SOI substrate 8 include, but are not limited to RIE, ion beam etching, plasma etching, and laser ablation. In one embodiment, a fluorocarbon-based etch chemistry may be employed to anisotropically etch the semiconductor materials of the top semiconductor layer 16, the epitaxial semiconductor layer 12 and the bottom semiconductor layer 10, and the dielectric material of the buried insulator layer 14. An upper portion of the pad dielectric stack 20 may be eroded during the anisotropic etch. The fluorocarbon based etch chemistry can employ an etchant such as $CF_4$, $CHF_3$, and/or $C3F_8$.

The moat trench 26 that is formed has a first depth d1 as measured from the topmost surface of the SOI substrate 8, and the capacitor trench 28 that is formed has a second depth d2 as measured from the topmost surface of the SOI substrate 8. The first depth d1 is greater than the second depth d2. The difference between the first depth d1 and the second depth d2 is caused by aspect ratio dependent etching (ARDE) or RIE lag, where the etch rate is dependent on the dimensions of the trench opening, i.e., smaller trenches etch at a lower rate than wider trenches. The RIE lag causes wider trenches to be etched deeper than smaller trenches. Further, etchant gas has easier access to the bottom of a wider trench than to the bottom of a narrow trench, thereby etching wider trench to a deeper depth than the narrow trench.

The moat trench 26 and the capacitor trench 28 extend through the top semiconductor layer 16, the buried insulator layer 14, and at least an upper portion of the epitaxial semiconductor layer 12. In one embodiment, the first depth d1 and the second depth d2 are selected such that the moat trench 26 extends through the top semiconductor layer 16, the buried insulator layer 14 and the epitaxial semiconductor layer 12 and into an upper portion of the bottom semiconductor layer 10, while the capacitor trench 28 extends through the top semiconductor layer 16 and the buried insulator layer 14 and into the epitaxial semiconductor layer 12 so that the bottom surface of the capacitor trench 28 is within the epitaxial semiconductor layer 12. The moat trench 26 that is formed laterally encloses a device region. Semiconductor devices formed on, or in, the portion of the top semiconductor layer 16 within that device region are electrically isolated from other semiconductor devices formed outside the moat trench 16.

Figure 3:
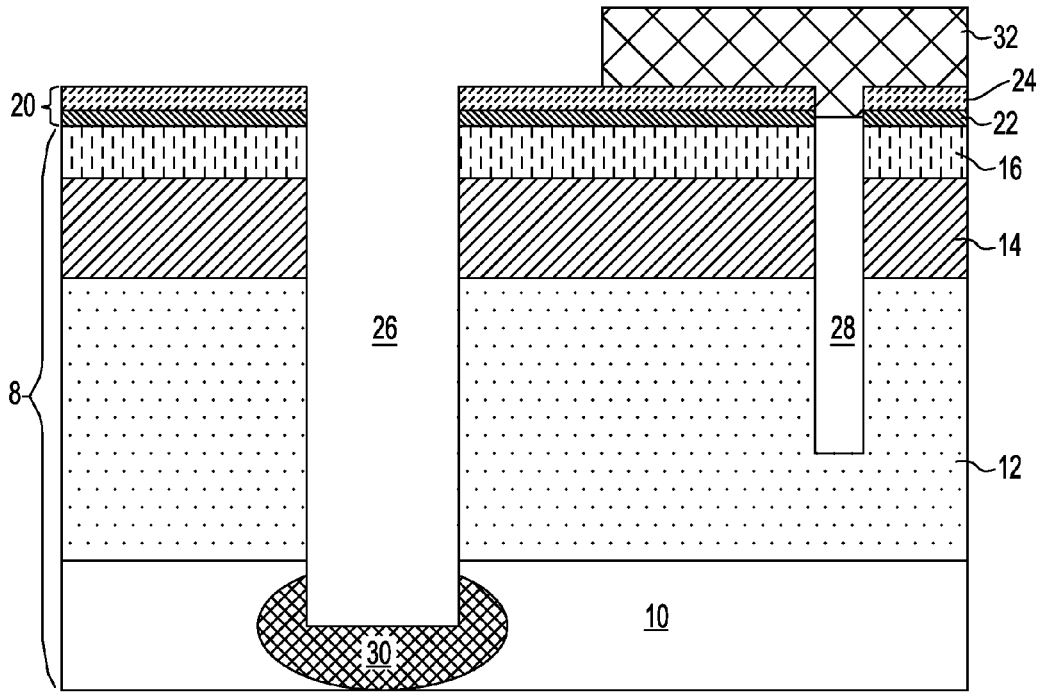
FIG. 3 is a cross-sectional view of the exemplary semiconductor structure of FIG. 2 after forming a dopant region in a bottom semiconductor layer of the SOI substrate at the bottom portion of the moat trench.

Referring to FIG. 3, a dopant region 30 is formed in the bottom semiconductor layer 10 at the bottom portion of the moat trench 26. The dopant region 30 can be formed by applying a photoresist (not shown) over the moat trench 26, the capacitor trench 28, and the top surface of the hard mask layer 24 and then lithographically patterning the photoresist to form a patterned photoresist 32. The patterned photoresist 32 covers the capacitor trench 28, while exposing the moat trench 26. Subsequently, dopants are implanted through the opening of the moat trench 26 into the exposed surface of the bottom semiconductor layer 10 by angled ion implantation to form the dopant region 30. In one embodiment and when the epitaxial semiconductor layer 12 is doped to an n-type conductivity, the dopant region 30 may be formed by ion implanting p-type dopants (e.g., boron) into the bottom semiconductor layer 10. In one embodiment, the p-type dopants may be ion implanted into the bottom semiconductor layer 10 using an energy of 0.5 keV to 15.0 keV with a dose of $1\times10^{13}$ atoms/$cm^2$ to $1\times10^{16}$ atoms/$cm^2$. In another embodiment, the p-type dopants may be ion implanted into the bottom semiconductor layer 10 with using an energy of 1 keV to 5 keV with a dose of $3\times10^{14}$ atoms/$cm^2$ to $3\times10^{15}$ atoms/$cm^2$. The concentration of the p-type dopants that are present in the dopant region 30 can be from $1\times10^{17}$ atoms/$cm^3$ to $5\times10^{21}$ atoms/$cm^3$. After forming the dopant region 30, the patterned photoresist 32 can be removed by a conventional resist strip process, such as, for example, ashing.

Figure 4:
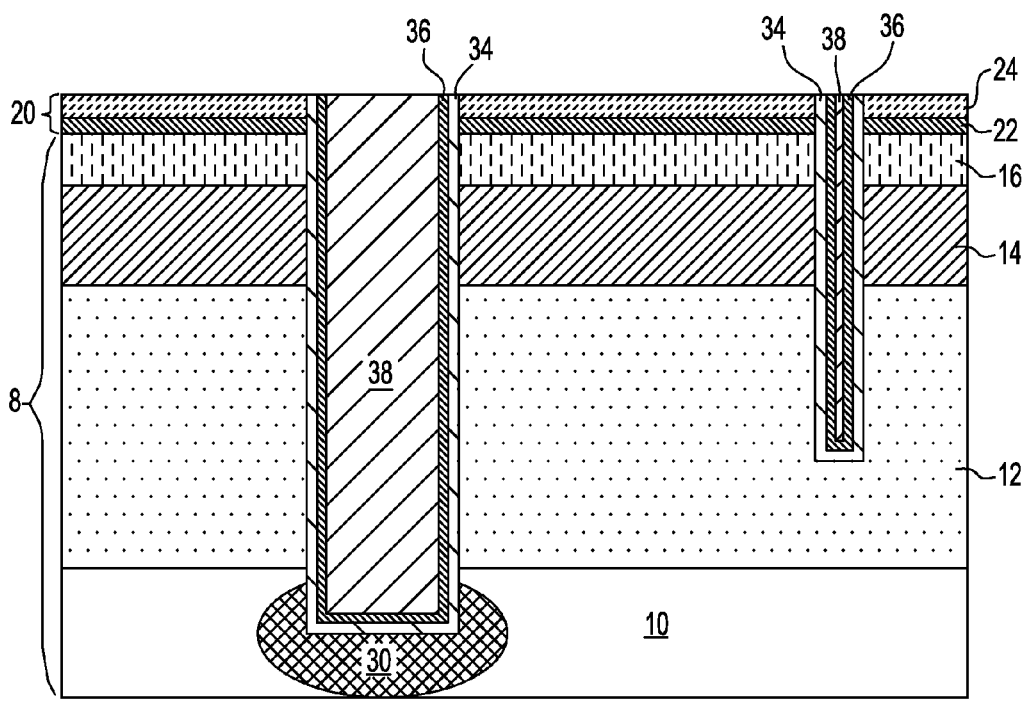
FIG. 4 is a cross-sectional view of the exemplary semiconductor structure of FIG. 3 after forming dielectric material layer portions, metal layer portions, and conductive fill material layer portions within the moat trench and the capacitor trench.

Referring to FIG. 4, dielectric material layer portions 34, metal layer portions 36 and conductive fill material layer portions 38 are formed within the moat trench 26 and the capacitor trench 28. A dielectric material layer (not shown) is deposited conformally on sidewalls and bottom surfaces of the moat trench 26 and the capacitor trench 28 as well as sidewalls and the topmost surface of the pad dielectric stack 20. The dielectric material layer can include any dielectric material, such as, for example, silicon nitride, silicon oxide, or a high-k metal oxide which can be aluminum oxide, zirconium oxide, hafnium oxide, or a combination thereof. The dielectric material layer may be deposited using a conventional deposition process such as, for example, CVD or atomic layer deposition (ALD). The dielectric material layer that is formed can have a thickness ranging from 2 nm to 10 nm, although lesser and greater thicknesses can also be employed.

A metal layer (not shown) is deposited conformally on the dielectric material layer. The metal layer can include a metal nitride such as, for example, TiN, TaN, WN, TiAlN, TaAlN, or a combination thereof. The metal layer may be deposited using a convention deposition process such as, for example, PVD or ALD. The metal layer that is formed can have a thickness ranging from 2 nm to 20 nm, although lesser and greater thicknesses can also be employed. In some embodiments of the present application, the metal layer can be omitted.

A conductive fill material layer (not shown) is deposited on the metal layer when present or on the dielectric material layer to completely fill the moat trench 26 and the capacitor trench 28. The conductive fill material layer includes a conductive material, which can be a doped semiconductor material or a metal. The doped semiconductor material can be doped polysilicon, doped germanium, a doped silicon germanium alloy, a doped compound semiconductor material, or combinations thereof. The metal can be W, Ti, Ta, Cu, or a combination thereof. The conductive fill material layer can be deposited by PVD, CVD, electroplating, electroless plating, or a combination thereof. The conductive fill material layer is deposited to a thickness that is sufficient to completely fill the moat trench 26 and the capacitor trench 28.

Portions of the conductive fill material layer, the metal layer and the dielectric material layer above the topmost surface of the pad dielectric stack 20 (i.e., the top surface of the hard mask layer 24) can be removed using a planarization process, such as, for example, chemical mechanical planarization (CMP) employing the top surface of the hard mask layer 24 as a stopping layer. Thus, all material portions are removed from above the top surface of the hard mask layer 24 such that top surfaces of the remaining portions of the dielectric material layer, the metal layer and the conductive fill material layer are coplanar with the top surface of the hard mask layer 24. The remaining portions of the dielectric material layer are herein referred to as the dielectric material layer portions 34. The remaining portions of the metal layer are herein referred to as the metal layer portions 36. The remaining portions of the conductive fill material layer are herein referred to as the conductive fill material layer portions 38.

Figure 5:
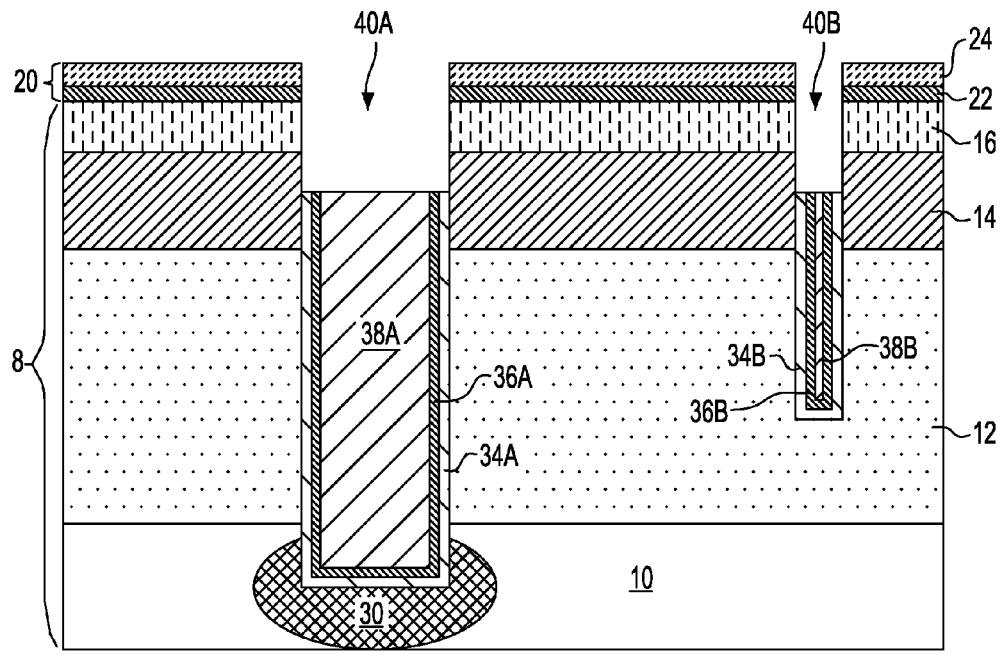
FIG. 5 is a cross-sectional view of the exemplary semiconductor structure of FIG. 4 after forming a DTMOAT and a deep trench capacitor in the SOI substrate.

Referring to FIG. 5, a DTMOAT and a deep trench capacitor are formed in the SOI substrate 8. The dielectric material layer portions 34, the metal layer portions 36 and the conductive fill material layer portions 38 that are present within the moat trench 26 and the capacitor trench 28 are recessed to a level between the top surface of the buried insulator layer 14 and the bottom surface of the buried insulator layer 14 by a recess etch.

The recess etch can be an anisotropic etch, such as RIE. The remaining portion of the dielectric material layer portions 34 within the moat trench 26 constitutes a dielectric liner 34A. The dielectric liner 34A contacts sidewalls and a bottom surface of the moat trench 26. The remaining portion of the metal layer portions 36 within the moat trench 26 constitutes a metal liner 36A. The remaining portion of the conductive fill material layer portions 38 within the moat trench 26 constitutes a trench conductor 38A. The dielectric liner 34A, the metal liner 36A and the trench conductor 38A together constitute a DTMOAT. The DTMOAT (34A, 36A, 38A) extends from the top semiconductor layer 16 through the buried insulator layer 14 and the epitaxial semiconductor layer 12 into contact with the bottom semiconductor layer 10.

The remaining portion of the dielectric material layer portions 34 within the capacitor trench 28 constitutes a node dielectric 34B. The node dielectric 34B contacts sidewalls and a bottom surface of the capacitor trench 28. The remaining portion of the metal layer portions 36 within the capacitor trench 28 (herein referred to as 36B) and the remaining portion of the conductive fill material layer portions 38 (herein referred to as 38B) within the capacitor trench 28 collectively provide an inner electrode (36B, 38B). The node dielectric 34B, the inner electrode (36B, 38B) and a portion of the epitaxial semiconductor layer 12 surrounding the capacitor trench 28 collectively constitute a deep trench capacitor. The portion of the epitaxial semiconductor layer 12 surrounding capacitor trench 28 serves as an outer electrode of the deep trench capacitor. The deep trench capacitor (34B, 36B, 38B, 12) extends from the top semiconductor layer 16 through the buried insulator layer 14 into contact with the epitaxial semiconductor layer 12. The deep trench capacitor (34B, 36B, 38B, 12) is not in direct contact with the bottom semiconductor layer 10.

The recess of the dielectric material layer portions 34, the metal layer portions 36 and the conductive fill material layer portions 38 also provides a first cavity 40A on top of the DTMOAT (34A, 36A, 38A) in the moat trench 26 and a second cavity 40B on top of the deep trench capacitor (34B, 36B, 38B, 12) in the capacitor trench 28.

FIGS. 6-13 depict steps for forming a first exemplary moat contact from the exemplary semiconductor structure of FIG. 4 in accordance with a first embodiment of the present application.

Figure 6:
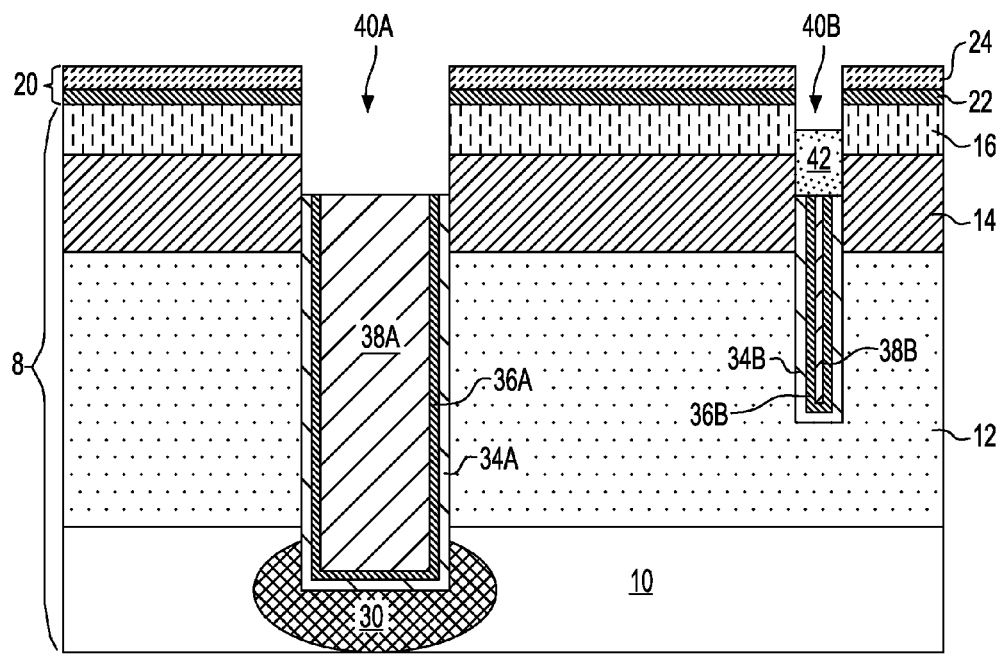
FIG. 6 is a cross-sectional view of a first exemplary semiconductor structure that can be derived from the exemplary semiconductor structure of FIG. 5 after forming a conductive strap structure on top of the deep trench capacitor in accordance with a first embodiment of the present application.

Referring to FIG. 6, a conductive strap structure 42 is formed in the second cavity 40B and on top of the deep trench capacitor (34B, 36B, 38B, 12). A photoresist (not shown) is applied and lithographically patterned so that a patterned photoresist (not shown) covers the DTMOAT (34A, 36A, 38A), while exposing deep trench capacitor (34B, 36B, 38B, 12). A conductive material is deposited within the second cavity 40B and above the hard mask layer 24, and subsequently recessed to provide the conductive strap structure 42. In one embodiment and as shown in FIG. 6, the top surface of the conductive strap structure 42 is located between the top surface of the top semiconductor layer 16 and the bottom surface of the top semiconductor layer 16.

The conductive material employed to form the conductor strap structure 42 can be a doped semiconductor material such as doped polysilicon, or a metal such as W, Ti, Ta, Cu, or Al. The conductive material can be deposited by PVD, CVD, electroplating, electroless plating, or a combination thereof. After forming the conductive strap structure 42, the patterned photoresist can be removed by, for example, ashing.

Figure 7:
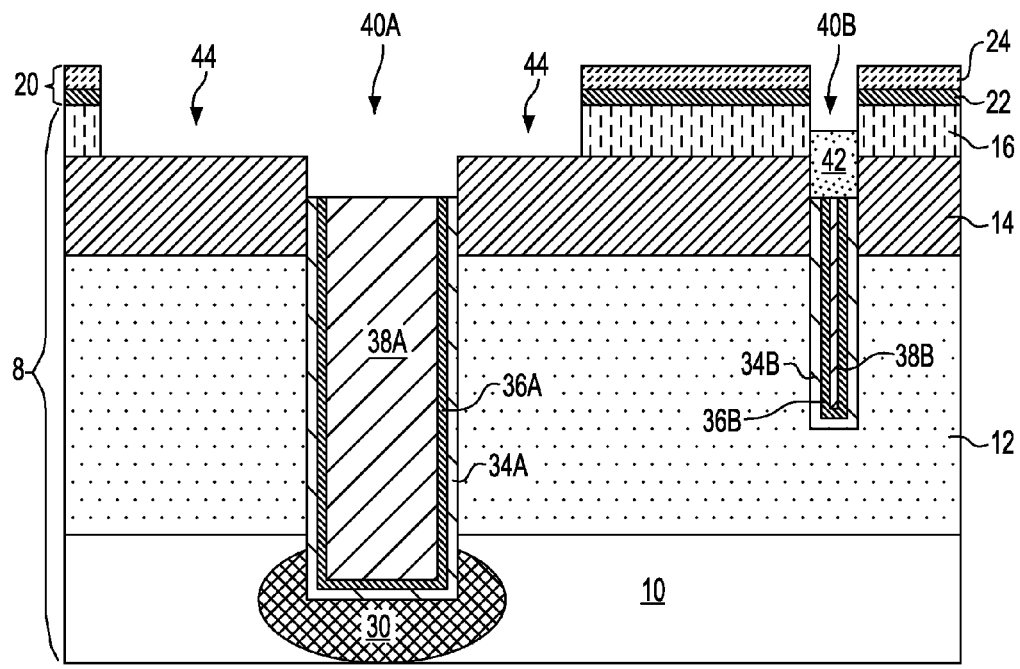
FIG. 7 is a cross-sectional view of the first exemplary semiconductor structure of FIG. 6 after forming shallow trenches within the top semiconductor layer.

Referring to FIG. 7, shallow trenches 44 are formed through the hard mask layer 24, the nitride pad layer 22 and the top semiconductor layer 16 to expose portions of the buried insulator layer 14. In one embodiment and as shown in FIG. 7, the shallow trenches 44 may intersect with the first cavity 40A. The shallow trenches 44 can be formed by applying a photoresist (not shown) over the hard mask layer 24, the DTMOAT (34A, 36A, 38A) and the conductive strap structure 42. The photoresist is then lithographically patterned to form a patterned photoresist (not shown) containing a pattern of the shallow trenches therein. The pattern in the patterned photoresist is transferred through the hard mask layer 24, the nitride pad layer 22 and the top semiconductor layer 16 to form the shallow trenches 44. After forming the shallow trenches 44, the patterned photoresist can be removed, for example, by ashing.

Figure 8:
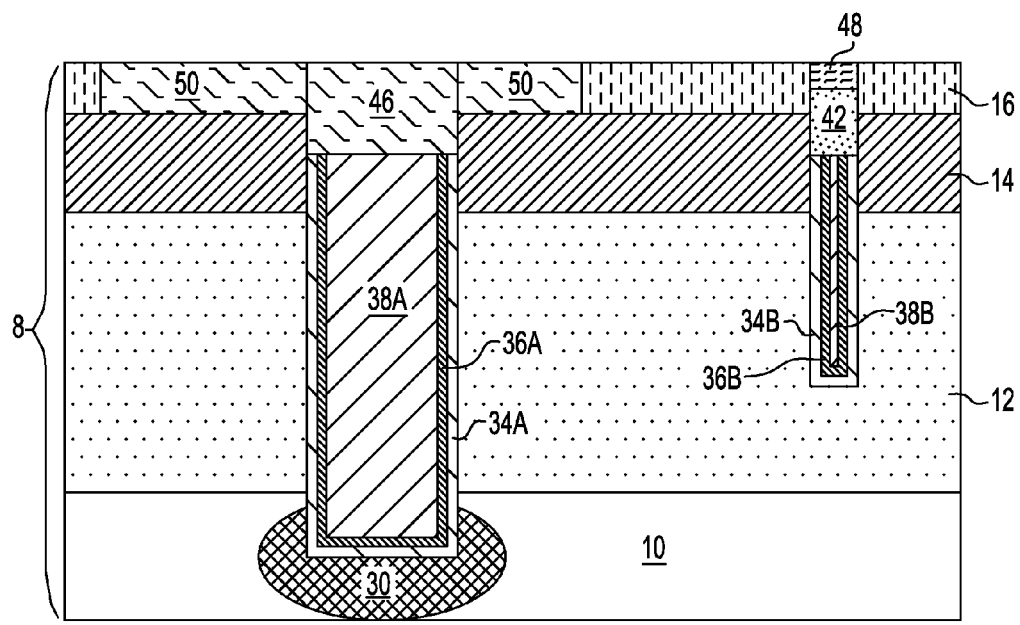
FIG. 8 is a cross-sectional view of the first exemplary semiconductor structure of FIG. 7 after forming a moat cap, a capacitor cap and shallow trench isolation (STI) regions.

Referring to FIG. 8, a moat cap 46, a capacitor cap 48 and shallow trench isolation (STI) regions 50 are formed. A dielectric fill material layer (not shown) is deposited within the first cavity 40A, the second cavity 40B and the shallow trenches 44 and above the top surface of the hard mask layer 24. The dielectric fill material layer can include a dielectric material such as silicon oxide, silicon oxynitride, or silicon nitride and can be formed by CVD or PECVD.

The dielectric fill material layer may be recessed, for example, by a recess etch. The recess depth of the dielectric fill material layer can be selected such that top surfaces of the remaining portions of the dielectric fill material layer are coplanar with the top surface of the top semiconductor layer 16. The hard mask layer 24, the nitride pad layer 22 may then be removed using a planarization process, such as CMP employing the top surface of the top semiconductor layer 16 as a stopping layer.

The remaining portion of the dielectric fill material layer within the first cavity 40A and on top of the DTMOAT (34A, 36A, 38A) is herein referred to as the moat cap 46. The remaining portion of the dielectric fill material layer within the second cavity 40B and overlying the conductive strap structure 42 is herein referred to as the capacitor cap 48. Remaining portions of the dielectric fill material layer within the shallow trenches 44 are herein referred to as the STI regions 50. In one embodiment and as shown in FIG. 8, the moat cap 46 is laterally surrounded by the STI regions 50. The moat cap 46 and the surrounding STI regions 50 form a unitary construction.

Figure 9:
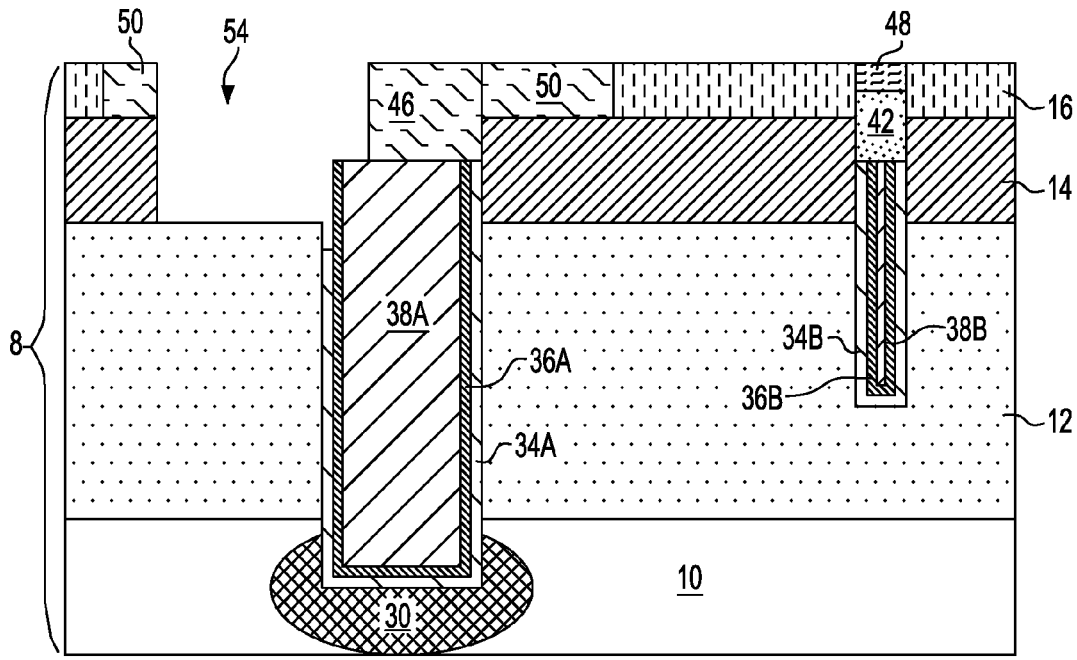
FIG. 9 is a cross-sectional view of the first exemplary semiconductor structure of FIG. 8 after forming a trench exposing a portion of an epitaxial semiconductor layer of the SOI substrate and an end portion of the DTMOAT.

Referring to FIG. 9, a trench 54 is formed extending through a STI region 50 adjoined to the moat cap 46 and the buried insulator layer 14. The trench 54 also extends through the moat cap 46. The right end of the trench 54 that is formed intersects the DTMOAT (34A, 36A, 38A) such that an end portion of the DTMOAT (34A, 36A, 38A) and a portion of the epitaxial semiconductor layer 12 adjacent to the end portion of the DTMOAT (34A, 36A, 38A) are exposed. This end portion includes a vertical portion of the dielectric liner 34A, a vertical portion of the metal liner 36A and a peripheral portion of the trench conductor 38A on one side of the DTMOAT (34A, 36A, 38A).

The trench 54 can be formed, for example, by applying a mask layer (not shown) over the top semiconductor layer 16, the moat cap 46, the capacitor cap 48 and the STI regions 50, lithographically patterning the mask layer, and transferring the pattern of the opening in the mask layer through the moat cap 46, a STI region 50 adjoined to the moat cap 46 and a portion of the buried insulator layer 14 underlying the STI regions 50. The mask layer can be a photoresist layer or a photoresist layer in conjunction with hard mask layer(s). An anisotropic etch having a chemistry that removes the dielectric materials of the moat cap 46, the STI regions 50, the buried insulator layer 14 and the dielectric liner 34A selective to the semiconductor material of the top semiconductor layer 16 and the conductive materials of the metal liner 36A and the trench conductor 38A can be employed to form the trench 54. The anisotropic etch may continue for a period of time so that the resulting over-etch completely removes the dielectric material of the buried insulator layer 14 from the top surface of the epitaxial semiconductor layer 12. The over-etch also recesses the exposed vertical portion of the dielectric liner 34A to a level below the top surface of the epitaxial semiconductor layer 12.

Figure 10:
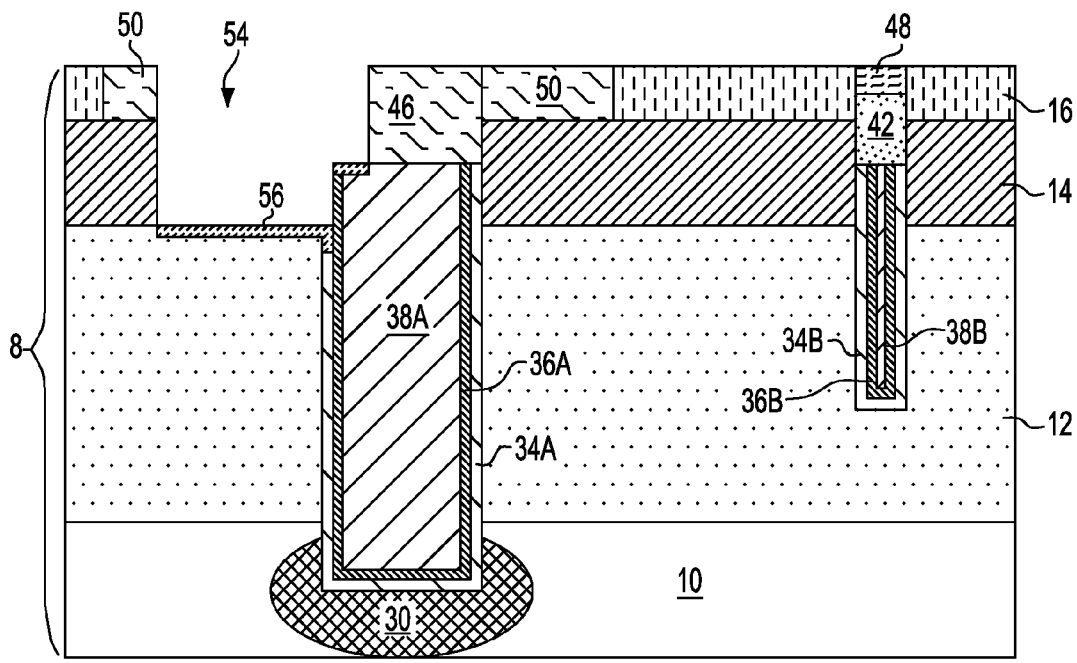
FIG. 10 is a cross-sectional view of the first exemplary semiconductor structure of FIG. 9 after forming metal semiconductor alloy portions on exposed surfaces of the epitaxial semiconductor layer and the trench conductor.

Referring to FIG. 10, metal semiconductor alloy portions 56 may be formed on exposed surfaces of the epitaxial semiconductor layer 12 and the trench conductor 38A when the trench conductor 38A is composed of a doped semiconductor material. The metal semiconductor alloy portions 56 may overlap with the exposed surface of the vertical portion of the metal liner 36A. The metal semiconductor alloy portions 56 may be composed of a silicide or a germicide. In one embodiment, forming the metal semiconductor alloy portions 56 includes depositing a metal layer (not shown) on the exposed surfaces of the epitaxial semiconductor layer 12 and the DTMOAT (34A, 36A, 38A) within the trench 54, annealing the metal layer to convert at least a portion of the metal layer and the exposed portions of the epitaxial semiconductor layer 12 and the trench conductor 38A into the metal semiconductor alloy portions 56, and removing the non-reacted portion of the metal layer by a selective strip process. The metal layer may be composed of nickel, platinum, cobalt or tungsten and may be deposited using PVD or CVD. In some embodiments of the present application, the metal semiconductor alloy portions 56 are optional and can be omitted.

Figure 11:
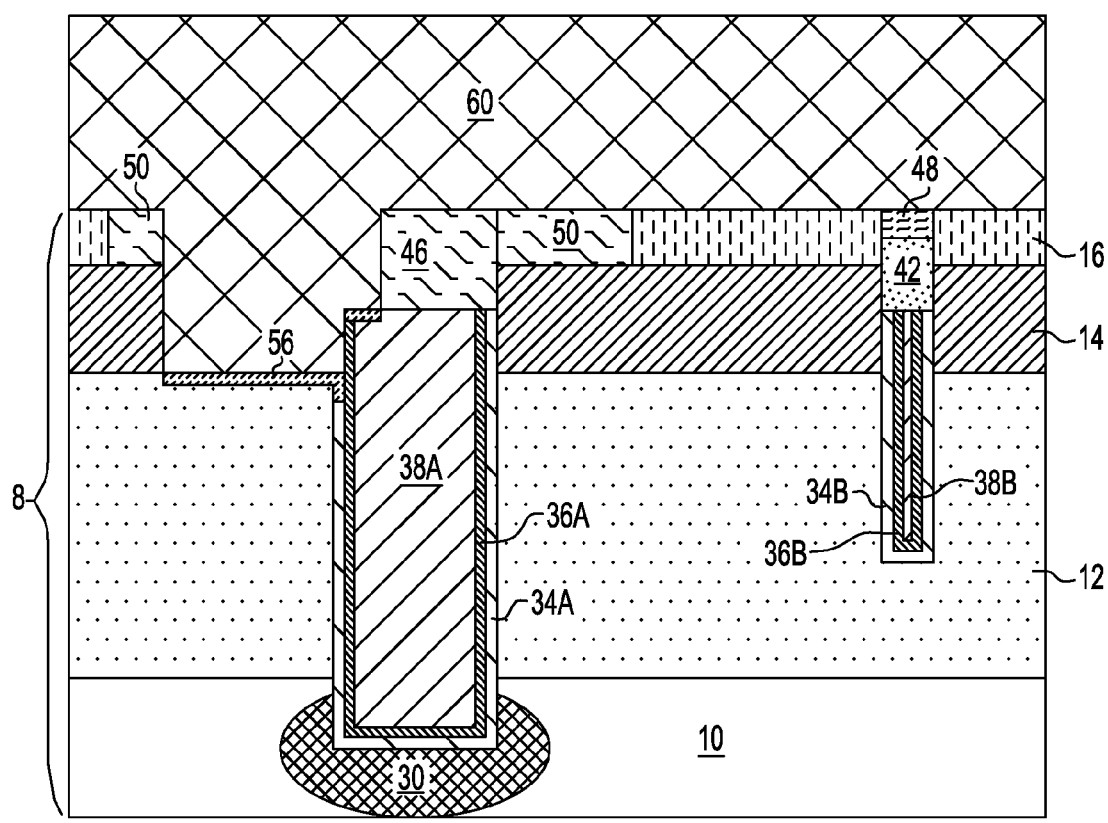
FIG. 11 is a cross-sectional view of the first exemplary semiconductor structure of FIG. 10 after forming a dielectric layer to completely fill the trench.

Referring to FIG. 11, a dielectric layer 60 is deposited over the top semiconductor layer 16, the moat cap 46, the capacitor cap 48 and the STI regions 50 and into the trench 54 to completely fill the trench 54. The dielectric layer 60 can include a dielectric material such as undoped silicon oxide, doped silicon oxide, porous or non-porous organosilicate glass, porous or non-porous nitrogen-doped organosilicate glass, or a combination thereof. The dielectric layer 60 can be formed by CVD, PVD or spin coating. If the dielectric dielectric layer 60 is not self-planarizing, the top surface of the dielectric layer 60 can be planarized, for example, by CMP. The top surface of the dielectric layer 60 thus is located above the top surface of the top semiconductor layer 16.

Figure 12:
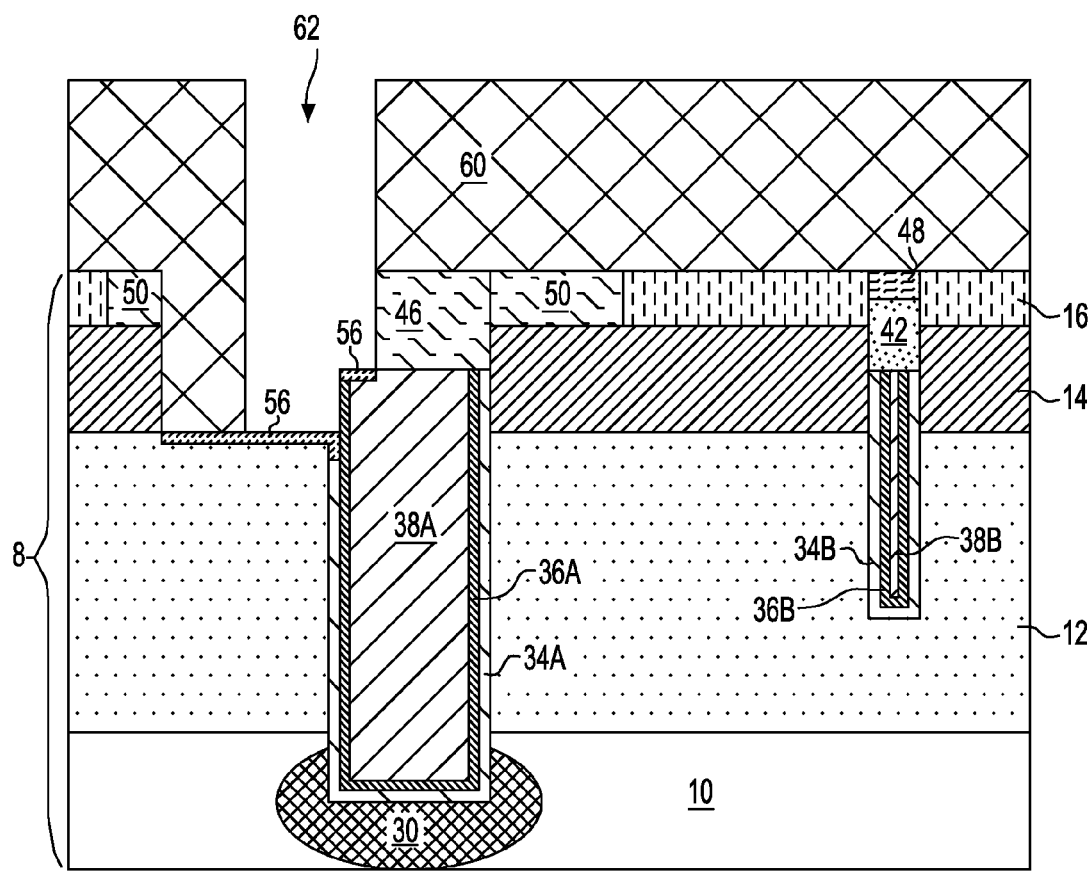
FIG. 12 is a cross-sectional view of the first exemplary semiconductor structure of FIG. 11 after forming a contact trench extending through the dielectric layer.

Referring to FIG. 12, a contact trench 62 is formed in the dielectric layer 60. The contact trench extends through the dielectric layer 60 to expose portions of the epitaxial semiconductor layer 12 and the DTMOAT (34A, 36A, 38A). The contact trench 62 can be formed by applying a mask layer (not shown) over the dielectric layer 60, and then lithographically patterning the mask layer to form an opening therein. The opening overlies the end portion of the DTMOAT (34A, 36A, 38A) and a portion of the epitaxial semiconductor layer 12 adjacent to the DTMOAT (34A, 36A, 38A). The mask layer can be a photoresist layer or a photoresist layer in conjunction with hard mask layer(s). The pattern in the mask layer is transferred through the dielectric layer 60 to form the contact trench 62. In one embodiment, an anisotropic etch, such as RIE, may be performed to remove the exposed portion of the dielectric layer 60. After forming the contact trench 62, the patterned mask layer can be removed by oxygen-based plasma etching.

Figure 13:
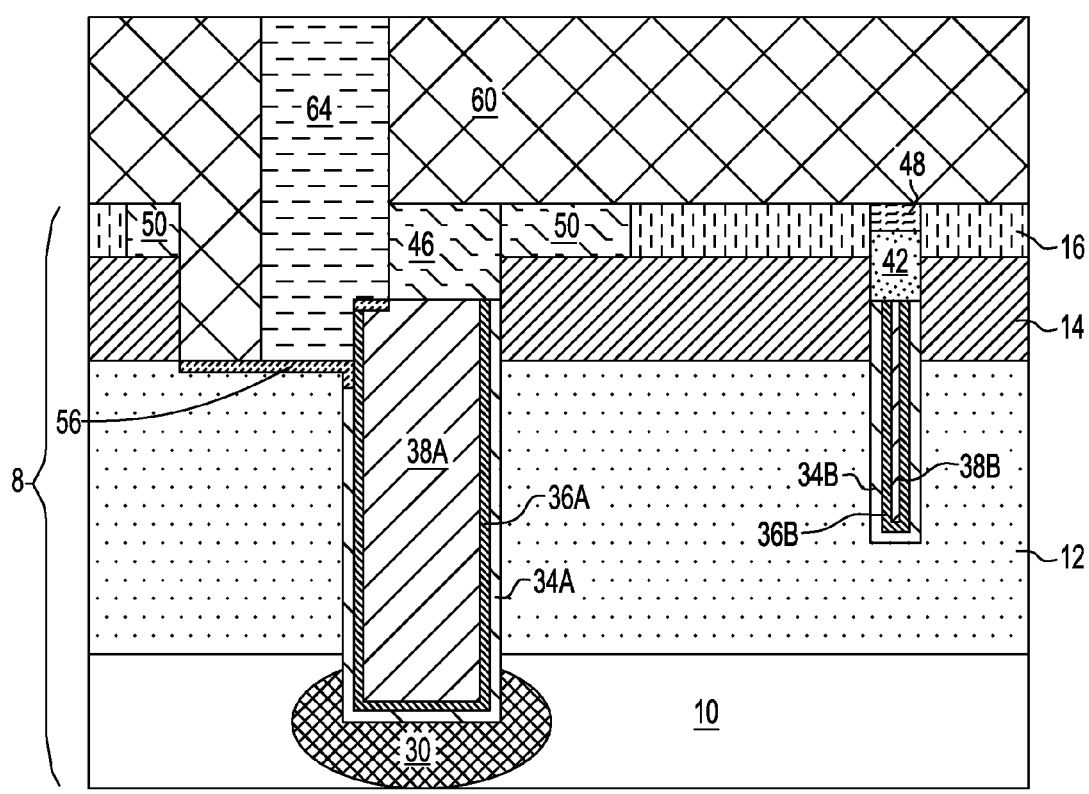
FIG. 13 is a cross-sectional view of the first exemplary semiconductor structure of FIG. 12 after forming a moat contact in accordance with the first embodiment of the present application.

Referring to FIG. 13, a moat contact 64 is formed within the contact trench 62. The moat contact 64 can be formed by depositing a metal in the contact trench 62 and removing excess conductive metal from above the dielectric layer 60 by a planarization process, which can be a recess etch or CMP. The metal may include tungsten, aluminum, copper or their alloys. The metal may be deposited by any suitable deposition method such as, for example, CVD, PVD or plating.

In the first embodiment of the present application, the moat contact 64 extends through the dielectric layer 60 to the epitaxial semiconductor layer 12 and is in contact with portions of the metal liner 36A and the trench conductor 38A, thus the DTMOAT (34A, 36A, 38A) is electrically connected to the epitaxial semiconductor layer 12 of the SOI substrate 8 directly. Charges accumulated in the DTMOAT (34A, 36A, 38A) can be discharged immediately through the heavily doped epitaxial semiconductor layer 12 to ground. The DTMOAT failure caused by the charge accumulation can thus be prevented.

FIGS. 14-20 depict steps for forming a second exemplary moat contact from the exemplary semiconductor structure of FIG. 8 in accordance with a second embodiment of the present application.

Figure 14:
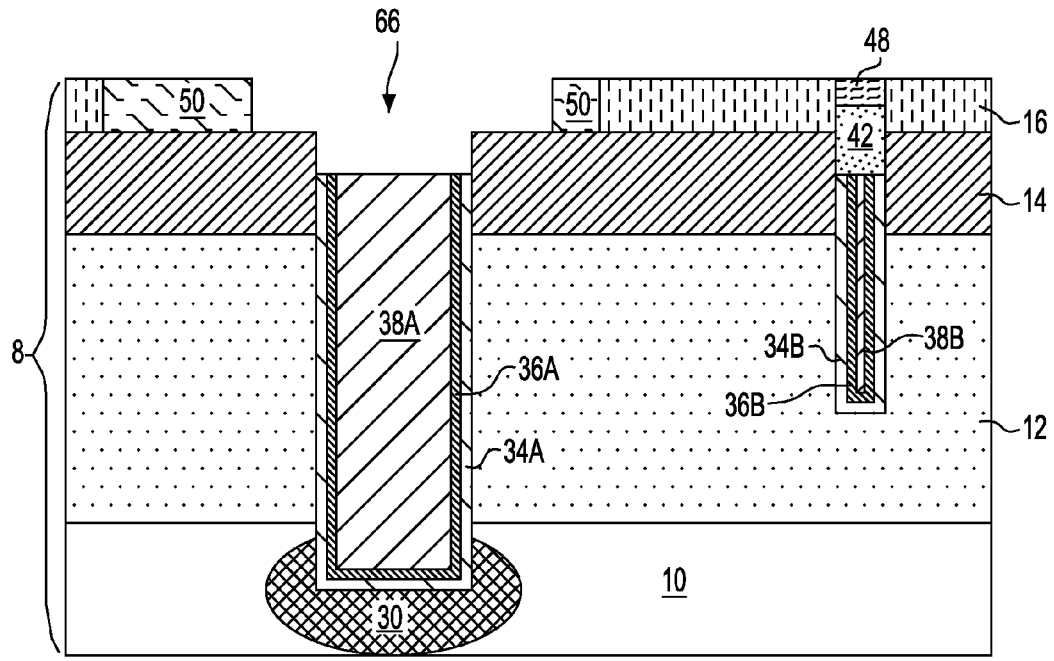
FIG. 14 is a cross-sectional view of a second exemplary semiconductor structure that can be derived from the first exemplary semiconductor structure of FIG. 8 after forming a trench to expose an entirety of topmost surfaces of the DTMOAT in accordance with a second embodiment of the present application.

Referring to FIG. 14, after forming the moat cap 46, the capacitor cap 48 and the STI regions 50, a trench 66 that extends through the moat cap 46 and portions of the STI regions 50 laterally surrounding the moat cap 46 is formed to expose an entirety of topmost surfaces of the DTMOAT (34A, 36A, 38A). The trench 66 is typically wider than the DTMOAT (34A, 36A, 38A) such that portions of the buried insulator layer 14 laterally surrounding the lower portion of the trench 66 are exposed. The trench 66 may be formed by applying a mask layer (not shown) over the top semiconductor layer 16, the moat cap 46, the capacitor cap 48 and the STI regions 50 and lithographically patterning the mask layer to expose the moat cap 46 and portions of the STI regions 50 laterally surrounding the moat cap 46. The mask layer can be a photoresist layer or a photoresist layer in conjunction with hard mask layer(s). An anisotropic etch such as RIE may then be performed to remove the exposed portions of moat cap 46 and the STI regions 50 selective to the dielectric material of the buried insulator layer 14. The patterned mask layer can be removed by oxygen-based plasma etching.

Figure 15:
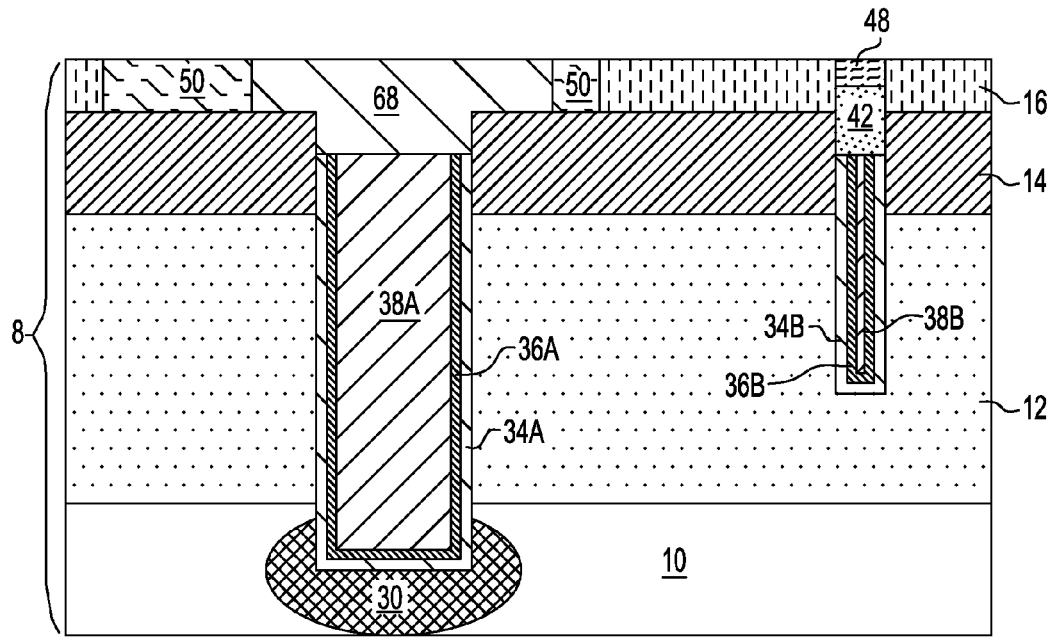
FIG. 15 is a cross-sectional view of the second exemplary semiconductor structure of FIG. 14 after forming a semiconductor cap within the trench.

Referring to FIG. 15, a semiconductor cap 68 is formed within the trench 66. A semiconductor material layer (not shown) may be deposited within the trench 66 and above the top semiconductor layer 16, the capacitor cap 48 and the STI regions 50 by a suitable deposition method, such as CVD or PVD. The semiconductor material layer may be recessed, for example, by a recess etch or CMP to provide the semiconductor cap 68 within the trench 66. The semiconductor cap 68 has a top surface coplanar with the top surface of the top semiconductor material layer 16 and has a bottommost surface in direct contact with the topmost surfaces of the DTMOAT (34A, 36A, 38A). The semiconductor material layer may include a silicon- or germanium-containing semiconductor material. The semiconductor materials of the semiconductor cap 68 and the top semiconductor layer 16 can be the same or different.

Figure 16:
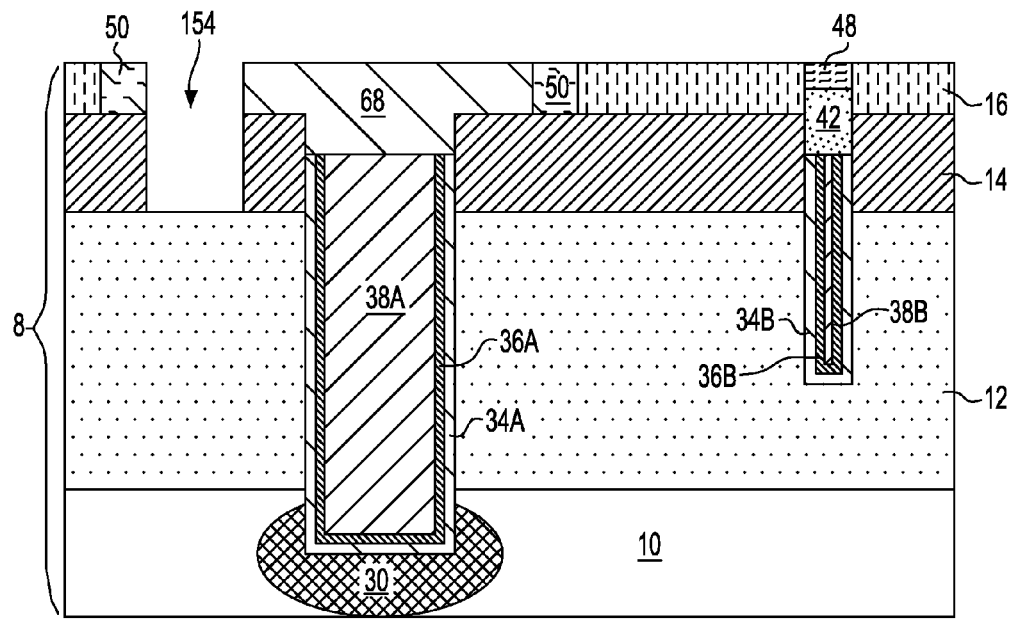
FIG. 16 is a cross-sectional view of the second exemplary semiconductor structure of FIG. 15 after forming a trench to expose a portion of the epitaxial semiconductor layer of the SOI substrate.

Referring to FIG. 16, a trench 154 extending through a portion of the STI regions 50 adjoined to the semiconductor cap 68 and a portion of the buried insulator layer 14 underlying the portion of the STI regions 50 is formed to expose a portion of the epitaxial semiconductor layer 12 and a sidewall of the semiconductor cap 68. The trench 154 can be formed using the same processing steps described above with respect to FIG. 9.

Figure 17:
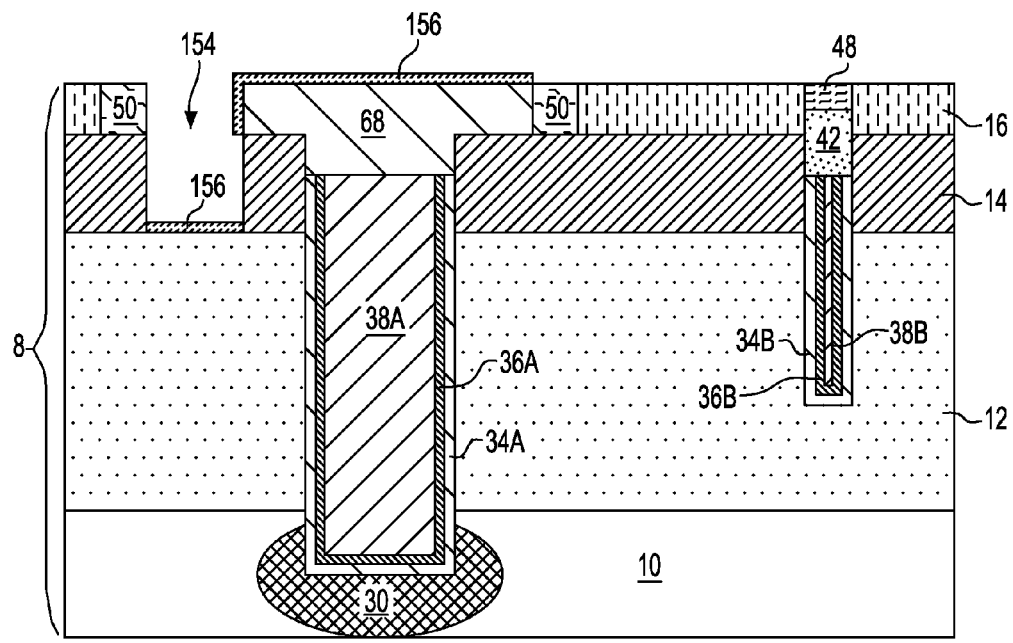
FIG. 17 is a cross-sectional view of the second exemplary semiconductor structure of FIG. 16 after forming metal semiconductor alloy portions on exposed surfaces of the epitaxial semiconductor layer and the semiconductor cap.

Referring to FIG. 17, metal semiconductor alloy portions 156 may be formed on exposed surfaces of the epitaxial semiconductor layer 12 and the semiconductor cap 68. The metal semiconductor alloy portions 156 can be formed using the same processing steps described above with respect to FIG. 10.

Figure 18:
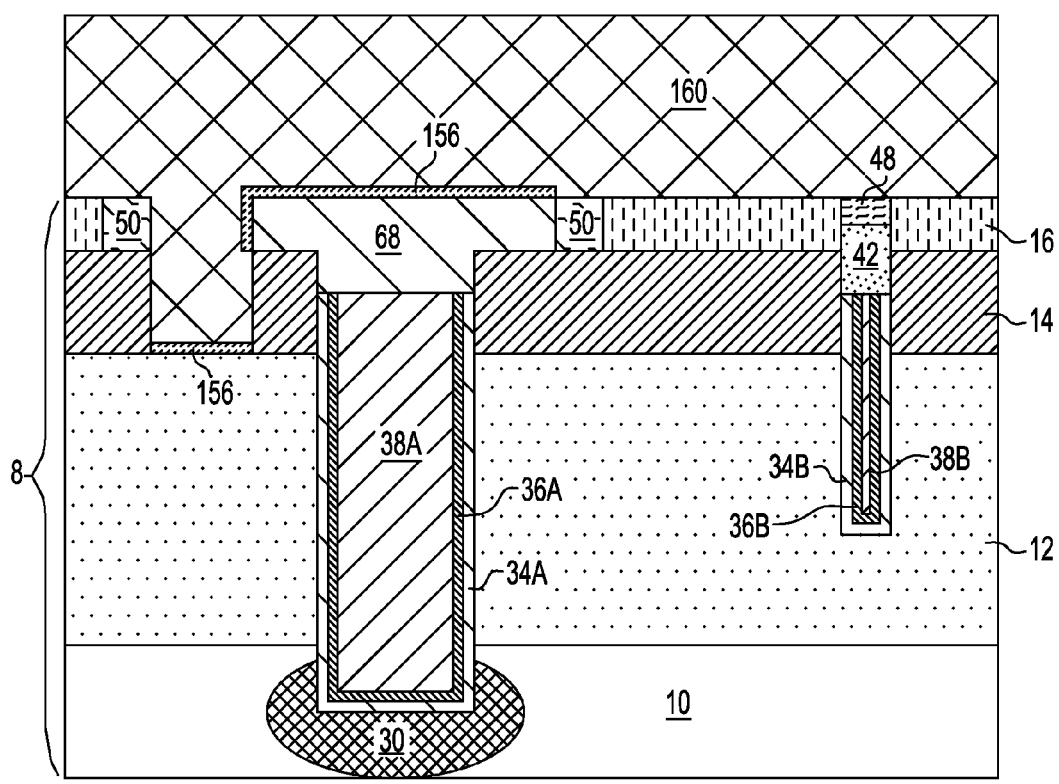
FIG. 18 is a cross-sectional view of the second exemplary semiconductor structure of FIG. 17 after forming a dielectric layer.

Referring to FIG. 18, a dielectric layer 160 may be formed to completely fill the trench 154 using the same processing steps described above with respect to FIG. 11.

Figure 19:
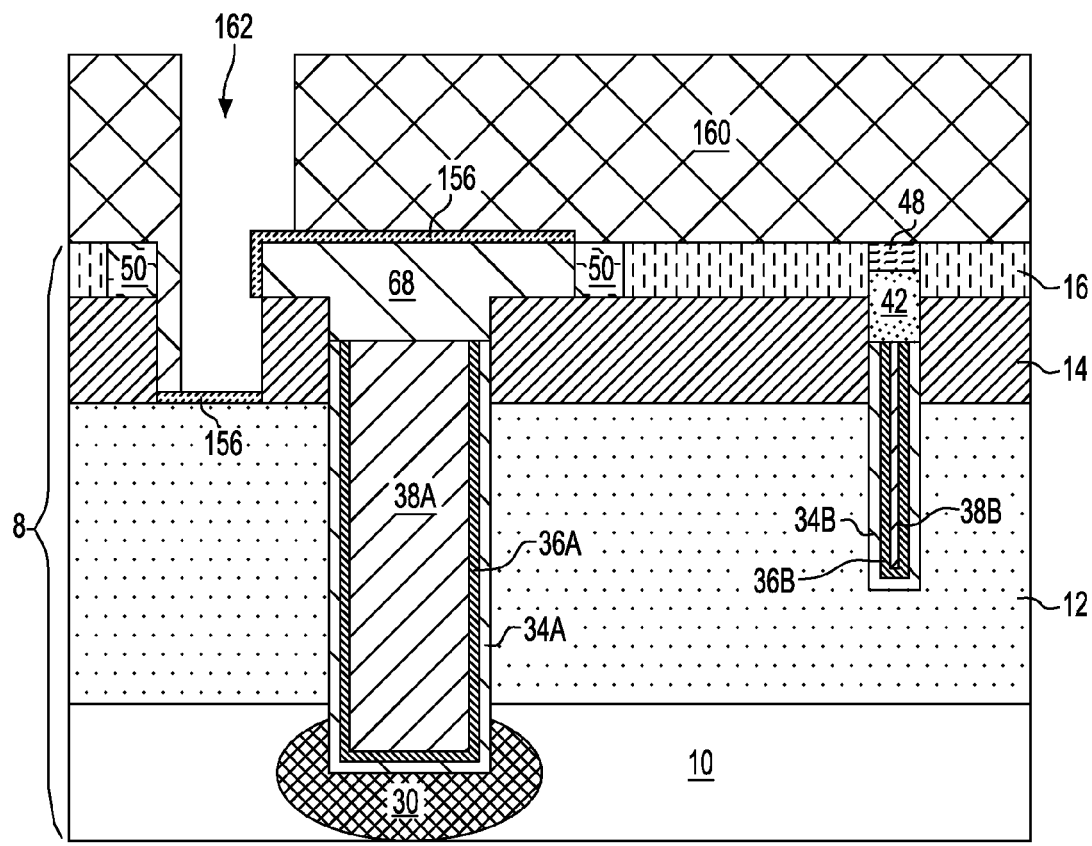
FIG. 19 is a cross-sectional view of the second exemplary semiconductor structure of FIG. 18 after forming a contact trench to expose a peripheral portion of the semiconductor cap and a portion of the epitaxial semiconductor material layer.

Referring to FIG. 19, a contact trench 162 may be formed through the dielectric layer 160 to expose a peripheral portion of the semiconductor cap 68 and a portion of the epitaxial semiconductor layer 12. The contact trench 162 may be formed using the same processing steps described above with respect to FIG. 12.

Figure 20:
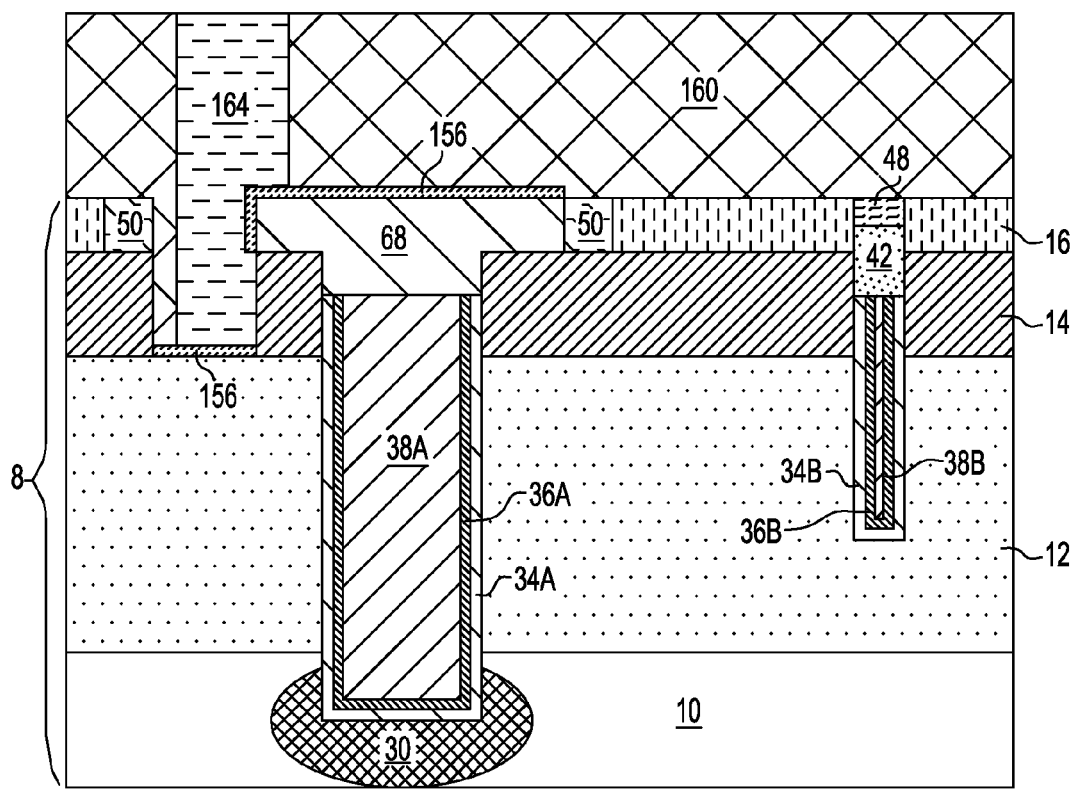
FIG. 20 is a cross-sectional view of the second exemplary semiconductor structure of FIG. 19 after forming a moat contact in accordance with the second embodiment of the present application.

Referring to FIG. 20, a moat contact 164 may be formed within the contact trench 162 using the same processing steps described above with respect to FIG. 12.

In the second embodiment of the present application, the moat contact 164 is in contact with the epitaxial semiconductor layer 12 and the semiconductor cap 68, thus the DTMOAT (34A, 36A, 38A) is electrically connected to the epitaxial semiconductor layer 12 of the SOI substrate 8 through the semiconductor cap 66. Charges accumulated in the DTMOAT (34A, 36A, 38A) can be discharged immediately through the heavily doped epitaxial semiconductor layer 12 to ground. The DTMOAT failure caused by the charge accumulation can thus be prevented.

Figure 21:
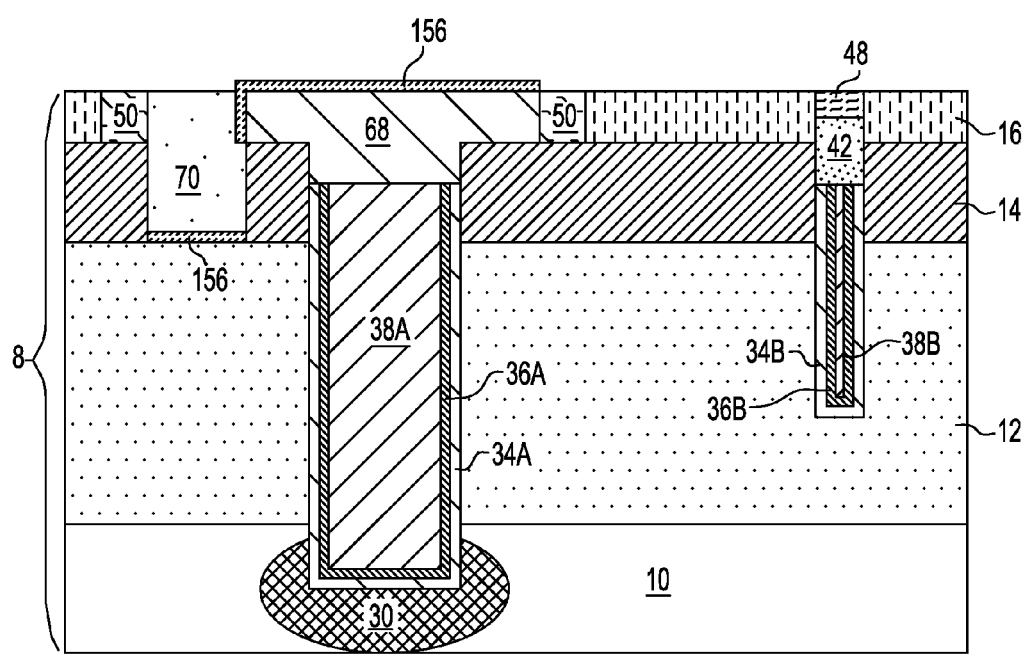
FIG. 21 is a cross-sectional view of a third exemplary semiconductor structure that can be derived from the second exemplary semiconductor structure of FIG. 17 after forming a first metal contact portion within the trench in accordance with a third embodiment of the present application.
Figure 22:
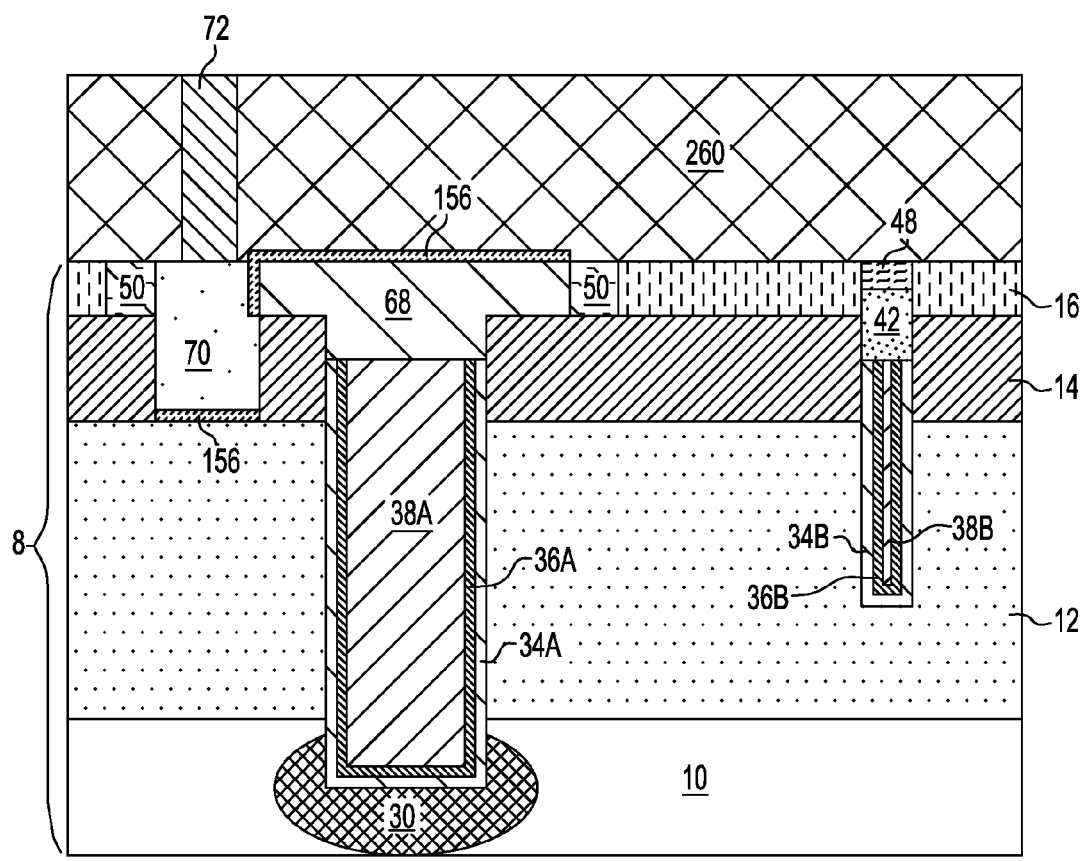
FIG. 22 is a cross-sectional view of the third exemplary semiconductor structure of FIG. 21 after forming a moat contact in accordance with the third embodiment of the present application.

FIGS. 21-22 depict steps for forming a third exemplary moat contact from the exemplary semiconductor structure of FIG. 17 in accordance with the third embodiment of the present application.

Referring to FIG. 21, after forming the trench 154, a first metal contact portion 70 may be formed within the trench 154. The first metal contact portion 70 is in contact with the top surface of the epitaxial semiconductor layer 12 and a sidewall of the semiconductor cap 68. The first metal contact portion 70 can be formed be depositing a first metal in the trench 154 by CVD or PVD until the trench 154 is completely filled. The first metals that can be employed to fill the trench 154 include, but are not limited to, tungsten, copper or aluminum.

Referring to FIG. 22, a second metal contact portion 72 may formed on top of the first metal contact portion 70. The second metal contact portion 72 can be formed by first forming a dielectric layer 260 on top of the top semiconductor layer 16, the capacitor cap 48, the STI regions 50, the semiconductor cap 68 and the first metal contact portion 70. The dielectric layer 260 is then lithographically patterned to form a contact trench (not shown) using the processing steps described above with respect to FIG. 12. The contact trench is subsequently filled with a second metal using the processing steps described above with respect to FIG. 13 to provide the second metal contact portion 72. The second metal may be the same as or different from the first metal. The second metals that can be employed to fill the contact trench include, but are not limited, to tungsten, copper, aluminum, or a silicide. The first metal contact portion 70 and the second metal contact portion 72 collectively constitute a moat contact.

In the third embodiment of the present application, the moat contact (70, 72) is in contact with the epitaxial semiconductor layer 12 and the semiconductor cap 68, thus the DTMOAT (34A, 36A, 38A) is electrically connected to the epitaxial semiconductor layer 12 of the SOI substrate 8 through the semiconductor cap 68. Charges accumulated in the DTMOAT (34A, 36A, 38A) can be discharged immediately through the heavily doped epitaxial semiconductor layer 12 to ground. The DTMOAT failure caused by the charge accumulation can thus be prevented.

Figure 23:
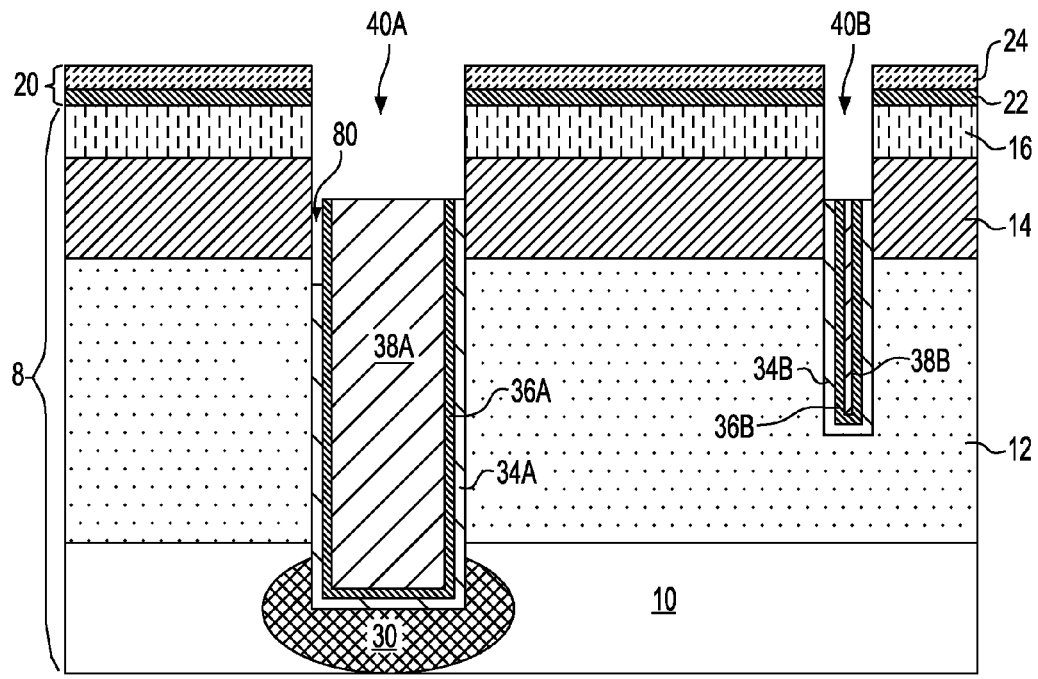
FIG. 23 is a cross-sectional view of a fourth exemplary semiconductor structure that can be derived from the exemplary semiconductor structure of FIG. 5 after forming a void between the epitaxial semiconductor layer of the SOI substrate and the DTMOAT in accordance with a fourth embodiment of the present application.
Figure 24:
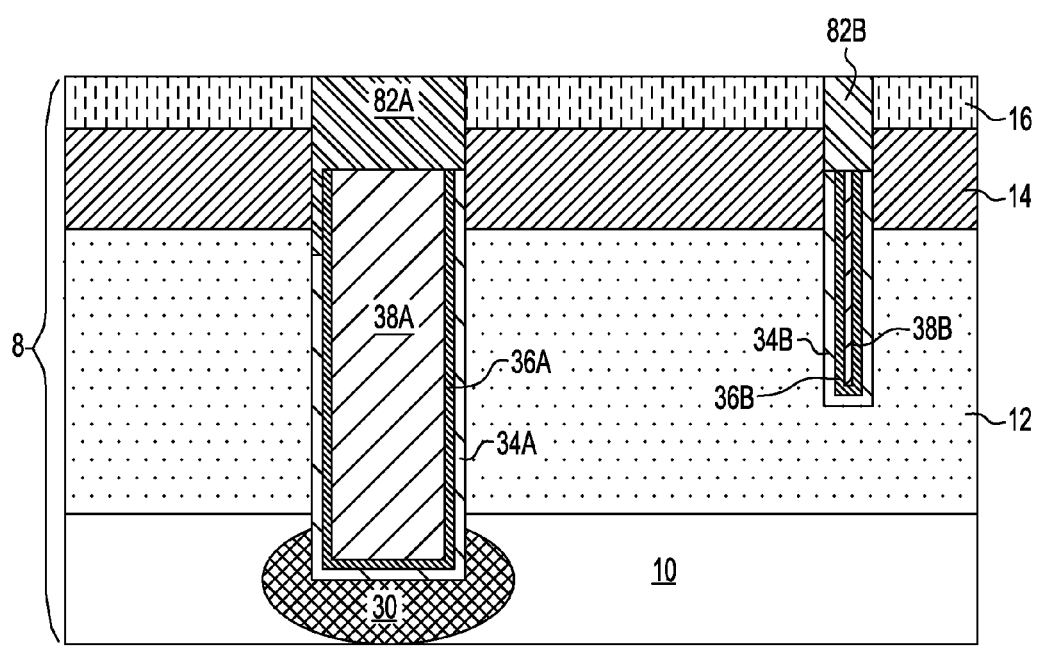
FIG. 24 is a cross-sectional view of the fourth exemplary semiconductor structure of FIG. 23 after forming a moat contact and a capacitor contact in accordance with the fourth embodiment of the present application.

FIGS. 23-24 depict steps for forming a fourth exemplary moat contact from the exemplary semiconductor structure of FIG. 5 in accordance with a fourth embodiment of the present application.

Referring FIG. 23, after forming the DTMOAT (34A, 36A, 38A) and the deep trench capacitor (34B, 36B, 38B, 12) and providing a first cavity 40A on top of the DTMOAT (34A, 36A, 38A) and a second cavity 40B on top of the deep trench capacitor (34B, 36B, 38B, 12), an upper portion of a vertical portion of the dielectric liner 34A on one side of the DTMOAT (34A, 36A, 38A) is recessed to a level below the top surface of the epitaxial semiconductor layer 12 to provide a void 80. The void 80 can be formed by depositing a photoresist (not shown) over the topmost surfaces of the pad dielectric stack 20, the DTMOAT (34A, 36A, 38A) and the deep trench capacitor (34B, 36B, 38B, 12) and lithographically patterning the photoresist to expose an end portion of DTMOAT (34A, 36A, 38A). An anisotropic etch can then be performed to recess the exposed vertical portion of the dielectric liner 34A until the top surface of the recessed vertical portion of dielectric liner 34A is located below the top surface of the epitaxial semiconductor layer 12. The void 80 is thus formed separating an upper portion of the epitaxial semiconductor layer 12 from an upper portion of a vertical portion of the metal liner 36A. The patterned photoresist can be removed by a conventional resist strip process, such as, for example, ashing.

Referring to FIG. 24, a moat contact 82A is formed within the first cavity 40A and the void 80 and a capacitor contact 82B is formed within second cavity 40B. The moat contact 82A and the capacitor contact 82B can be formed by depositing a conductive material in the first cavity 40A, the void 80 and the second cavity 40B by CVD or PVD. The conductive material may be a doped semiconductor, such as doped polysilicon, or a metal. The pad dielectric stack 20 and the deposited conductive material above the pad dielectric stack 20 may be removed using CMP using the top semiconductor layer 16 as a stopping layer. The moat contact 82A that is in contact with the DTMOAT (34A, 36A, 38A) and a portion of a sidewall of the epitaxial semiconductor layer 12 and the capacitor contact 82A that is in contact with the deep trench capacitor (34B, 36B, 38B, 12) are thus formed. The top surfaces of the moat contact 82A that is present within the moat trench 26 and the capacitor contact 82B that is present within the capacitor trench 28 may be coplanar with the top surface of the top semiconductor layer 16.

In the fourth embodiment of the present application, the moat contact 82A that is formed on top of the DTMOAT (34A, 36A, 38A) extends from the top semiconductor layer 16 through the buried insulator layer 14 into contact with a sidewall of the epitaxial semiconductor layer 12, thus the DTMOAT (34A, 36A, 38A) is electrically connected to the epitaxial semiconductor layer 12 of the SOI substrate 8.

Charges accumulated in the DTMOAT (34A, 36A, 38A) can be discharged immediately through the heavily doped epitaxial semiconductor layer 12 to ground. The DTMOAT failure caused by the charge accumulation can thus be prevented.

Figure 25:
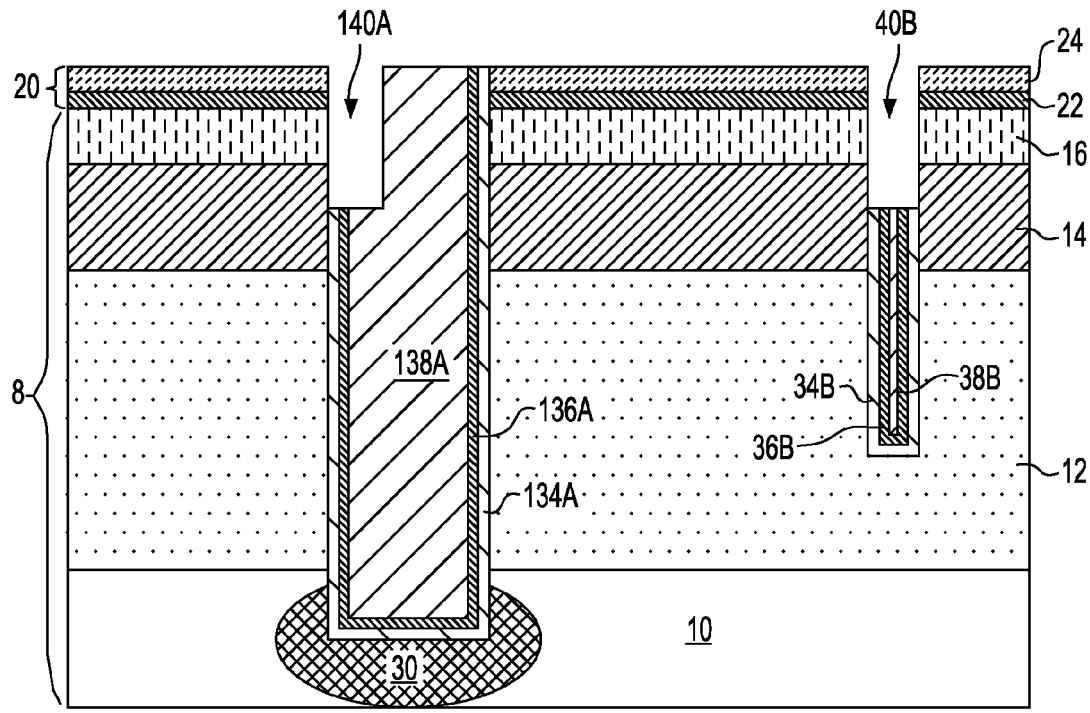
FIG. 25 is a cross-sectional view of a fifth exemplary semiconductor structure that can be derived from the exemplary semiconductor structure of FIG. 4 after forming a DTMOAT having a recessed peripheral portion and a deep trench capacitor in accordance with a fifth embodiment of the present application.
Figure 26:
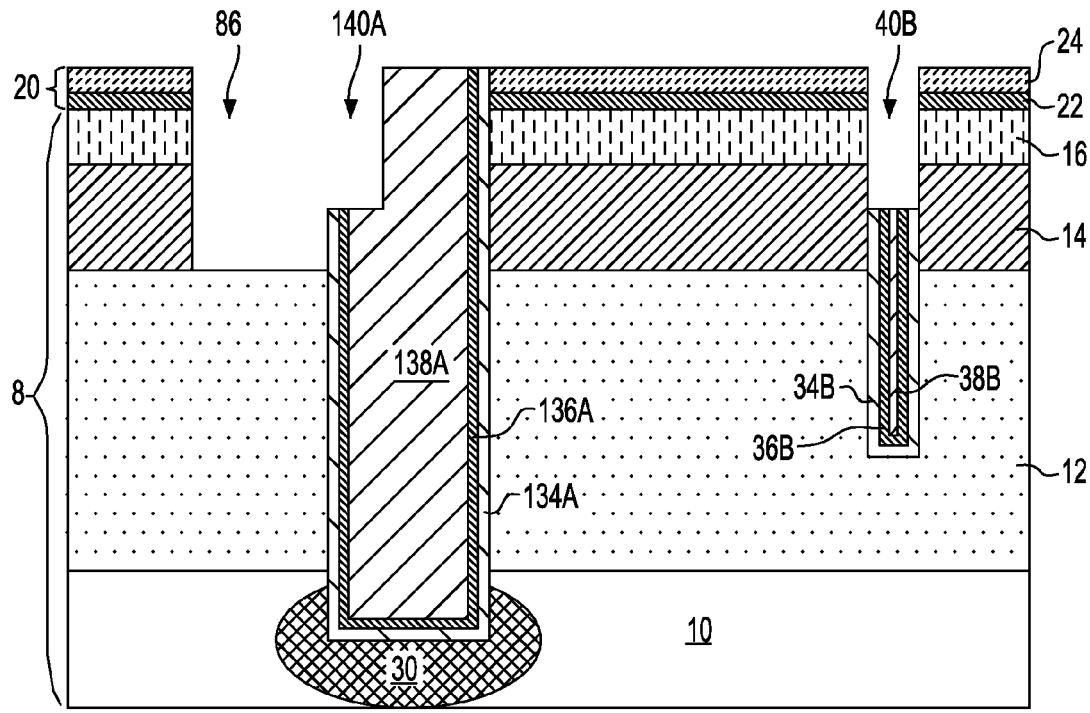
FIG. 26 is a cross-sectional view of the fifth exemplary semiconductor structure of FIG. 25 after forming a contact trench to expose a portion of the epitaxial semiconductor layer of the SOI substrate.
Figure 27:
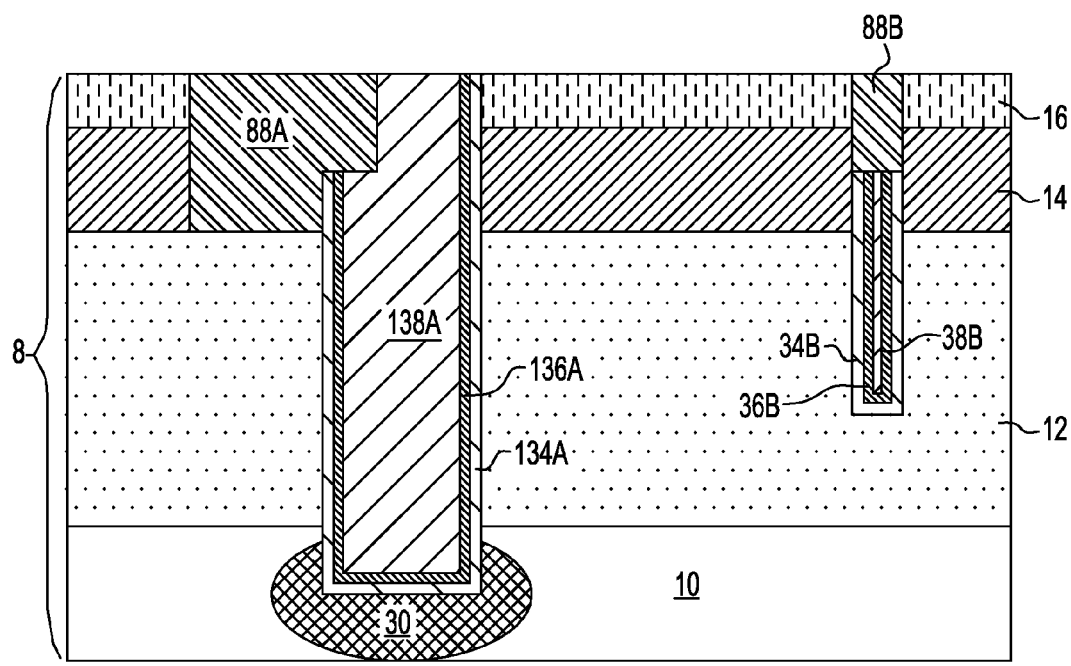
FIG. 27 is a cross-sectional view of the fifth exemplary semiconductor structure of FIG. 26 after forming a moat contact and a capacitor contact in accordance with the fifth embodiment of the present application.

FIGS. 25-27 depict steps for forming a fifth exemplary moat contact from the exemplary semiconductor structure of FIG. 4 in accordance with a fifth embodiment of the present application.

Referring to FIG. 25, after forming the dielectric material layer portions 34, the metal layer portions 36 and the conductive fill material layer portions 38 in the moat trench 26 and the capacitor trench 28, peripheral portions of the dielectric material layer portions 34, the metal layer portions 36 and the conductive fill material layer portions 38 that are present within the moat trench 26 and an entirety of portions of the dielectric material layer portions 34, the metal layer portions 36 and the conductive fill material layer portions 38 that are present within the capacitor trench 28 are recessed to a level between the top surface of the buried insulator layer 14 and the bottom surface of the buried insulator layer 14 to provide a DTMOAT (134A, 136A, 138A) having a recessed peripheral portion and a deep trench capacitor (34B, 36B, 38B, 12) using the processing steps described above with respect to FIG. 5. The recess process also provides a first cavity 140A in the moat trench 26 exposing the recessed portion of the DTMOAT (134A, 136A, 138A) and a second cavity 40B in the capacitor trench 28 exposing an entire top surface of the deep trench capacitor (34B, 36B, 38B, 12). The recessed portion of the DTMOAT (134A, 136A, 138A) includes a vertical portion of the dielectric liner 134A, a vertical portion of the metal liner 136A and a peripheral portion of the trench conductor 138A on one side of the DTMOAT (134A, 136A, 138A).

Referring to FIG. 26, a contact trench 86 is formed to expose a portion of epitaxial semiconductor layer 12 adjoined to the DTMOAT (134A, 136A, 138A). The right end of the contact trench 86 intersects the first cavity 140A. The contact trench 86 can be formed by etching through the hard mask layer 24, the nitride pad layer 22, the top semiconductor layer 16 and the buried insulator layer 14 utilizing lithography and etching processes.

Referring to FIG. 27, a moat contact 88A is formed within the contact trench 86 and the first cavity 140A and a capacitor contact 88B is formed within the second cavity 40B using the processing steps described above with respect to FIG. 24. Top surfaces of the moat contact 88A and the capacitor contacts 88B are coplanar with the top surface of the top semiconductor layer 16. The moat contact 88A contacts the recessed vertical portion of the metal liner 136A and the recessed peripheral portion of the trench conductor 138A present on one side of the DTMOAT (134A, 136A, 138A) and a portion of the epitaxial semiconductor layer 12 adjoined the DTMOAT (134A, 136A, 138A).

In the fifth embodiment of the present application, the moat contact 88A are in direct contact with the top surface of the epitaxial semiconductor layer 12 and a peripheral portion of the DTMOAT (134A, 136A, 138A), thus the DTMOAT (134A, 136A, 138A) is electrically connected to the epitaxial semiconductor layer 12 of the SOI substrate 8. Charges accumulated in the DTMOAT (134A, 136A, 138A) can be discharged immediately through the heavily doped epitaxial semiconductor layer 12 to ground. The DTMOAT failure caused by the charge accumulation can thus be prevented.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a semiconductor-on-insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer;
   a deep trench moat (DTMOAT) disposed in the SOI substrate and having a bottom surface contacting a dopant region of the bottom semiconductor layer; and
   a moat contact electrically connecting the DTMOAT to the epitaxial semiconductor layer of the SOI substrate, wherein the moat contact is in direct contact with an end portion of the DTMOAT on one side of the DTMOAT and a portion of the epitaxial semiconductor layer.

2. The semiconductor structure of claim 1, wherein the DTMOAT comprises at least a dielectric liner present on sidewalls and a bottom surface of a moat trench that extends from a top surface of the top semiconductor layer through the buried insulator layer and the epitaxial semiconductor layer and into the bottom semiconductor layer and a trench conductor present on the dielectric liner that fills a portion of the moat trench.

3. The semiconductor structure of claim 2, wherein topmost surfaces of the DTMOAT are located between a top surface of the buried insulator layer and a bottom surface of the buried insulator layer.

4. A semiconductor structure comprising:
   a semiconductor-on-insulator (SOI) substrate comprising a bottom semiconductor layer, an epitaxial semiconductor layer present on the bottom semiconductor layer, a buried insulator layer present on the epitaxial semiconductor layer, and a top semiconductor layer present on the buried insulator layer;
   a deep trench moat (DTMOAT) disposed in the SOI substrate and having a bottom surface contacting a dopant region of the bottom semiconductor layer;
   a moat contact electrically connecting the DTMOAT to the epitaxial semiconductor layer of the SOI substrate: and
   a semiconductor cap on top of the DTMOAT, wherein the semiconductor cap has a width greater than a width of the DTMOAT.

5. The semiconductor structure of claim 4, further comprising metal semiconductor alloy portions present on a top surface and a sidewall of the semiconductor cap and a portion of a top surface of the epitaxial semiconductor layer.

6. The semiconductor structure of claim 5, wherein the moat contact is in direct contact with portions of the metal semiconductor alloy portions present on the top surface and the sidewall of the semiconductor cap and the portion of the top surface of the epitaxial semiconductor layer.

7. The semiconductor structure of claim 5, wherein the moat contact comprises a first metal contact portion of a first metal in contact with portions of the metal semiconductor alloy portions present on the top surface and the sidewall of the semiconductor cap and the portion of the top surface of the epitaxial semiconductor layer, and a second metal contact portion of a second metal present on top of the first metal contact portion, wherein the second metal is different from the first metal.

8. A semiconductor structure comprising:
- a semiconductor-on-insulator (SOI)substrate comprising a bottom semiconductor layer, an epitaxial semiconductor layer present on the bottom semiconductor layer, a buried insulator layer present on the epitaxial semiconductor layer, and a top semiconductor layer present on the buried insulator layer;
- a deep trench moat (DTMOAT) disposed in the SOI substrate and having a bottom surface contacting a dopant region of the bottom semiconductor layer, wherein topmost surfaces of a first portion of the DTMOAT is located between a top surface of the buried insulator layer and a bottom surface of the buried insulator layer, and topmost surfaces of a second portion of the DTMOAT is coplanar with a top surface of the top semiconductor layer; and
- a moat contact electrically connecting the DTMOAT to the epitaxial semiconductor layer of the SOI substrate.

9. The semiconductor structure of claim 8, wherein the moat contact is in contact with the topmost surfaces of the first portion of the DTMOAT, a sidewall of the second portion of the DTMOAT, and a portion of the epitaxial semiconductor layer adjoined to the first portion of the DTMOAT.

* * * * *